US012738958B2

(12) United States Patent
He et al.

(10) Patent No.: US 12,738,958 B2
(45) Date of Patent: Sep. 15, 2026

(54) ENCODING METHOD, DECODING METHOD, APPARATUS, DEVICE, SYSTEM, AND READABLE STORAGE MEDIUM

(71) Applicant: HUAWEI TECHNOLOGIES CO., LTD., Shenzhen (CN)

(72) Inventors: Xiang He, Beijing (CN); Xinyuan Wang, Beijing (CN); Hao Ren, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 148 days.

(21) Appl. No.: 18/761,770

(22) Filed: Jul. 2, 2024

(65) Prior Publication Data

US 2024/0356564 A1 Oct. 24, 2024

Related U.S. Application Data

(63) Continuation of application No. PCT/CN2022/142363, filed on Dec. 27, 2022.

(30) Foreign Application Priority Data

Jan. 5, 2022 (CN) ......................... 202210005434.5
Jan. 30, 2022 (CN) ......................... 202210114840.5

(51) Int. Cl.
*H03M 7/00* (2006.01)
*H03M 7/30* (2006.01)

(52) U.S. Cl.
CPC ....... *H03M 7/6011* (2013.01); *H03M 7/6005* (2013.01)

(58) Field of Classification Search
CPC ............. H03M 7/6011; H03M 7/6005; H03M 7/6041; H03M 13/1575; H04M 7/70
(Continued)

(56) References Cited

U.S. PATENT DOCUMENTS 7,382,878 B2 * 6/2008 Volpert, Jr. ............. H04L 9/065 380/37
2011/0013690 A1 1/2011 Kobayashi et al.
(Continued)

FOREIGN PATENT DOCUMENTS

CN 101610134 A 12/2009
CN 110971531 A 4/2020
(Continued)

OTHER PUBLICATIONS

Toyoda H et al: "A 100-GB-ethernet subsystem for next-generation metro-area network", Communications, 2005. ICC 2005. 2005 IEEE International Conference on Seoul, Korea May 16-20, 2005, Piscataway, NJ, USA, IEEE, vol. 2, May 16, 2005 (May 16, 2005), pp. 1036-1042, XP010825445.
(Continued)

*Primary Examiner* — Peguy Jean Pierre
(74) *Attorney, Agent, or Firm* — WOMBLE BOND DICKINSON (US) LLP

(57) ABSTRACT

This application discloses an encoding method including: obtaining $2^n$ groups of code stream blocks including control blocks and data blocks; and performing first encoding on the $2^n$ groups of code stream blocks to obtain a target code block, where the target code block includes a type determined based on the control blocks in the $2^n$ groups of code stream blocks and a data unit determined based on the control blocks and the data blocks in the $2^n$ groups of code stream blocks. The decoding method includes: obtaining a target code block, and performing first decoding on the target code block based on a type and a data unit of the target code block, to obtain $2^n$ groups of code stream blocks, where each group of code stream blocks includes a control block and a data block that are obtained based on the type and the data unit.

20 Claims, 6 Drawing Sheets

(58) Field of Classification Search
USPC ...................................................... 341/50, 51
See application file for complete search history.

(56) References Cited

U.S. PATENT DOCUMENTS

| | | | | |
|---|---|---|---|---|
| 2013/0346823 | A1 | 12/2013 | Cideciyan | |
| 2016/0182084 | A1* | 6/2016 | Yang | H03M 7/30<br>341/87 |
| 2018/0159785 | A1 | 6/2018 | Wu et al. | |
| 2023/0396360 | A1* | 12/2023 | Zhang | H04L 25/4908 |

FOREIGN PATENT DOCUMENTS

| | | | |
|---|---|---|---|
| CN | 112468259 | A | 3/2021 |
| EP | 4443782 | A1 | 10/2024 |

OTHER PUBLICATIONS

John D'Ambrosia, Dell Chair, "Baseline Summary", IEEE P802.3bs 400 GbE Task Force, Jul. 18, 2015, total 183 pages.
Chris DiMinico:"100GBASE-CR4 Specifications", IEEE 802.3bj Minneapolis, MN, May 2012, total 24 pages.

* cited by examiner

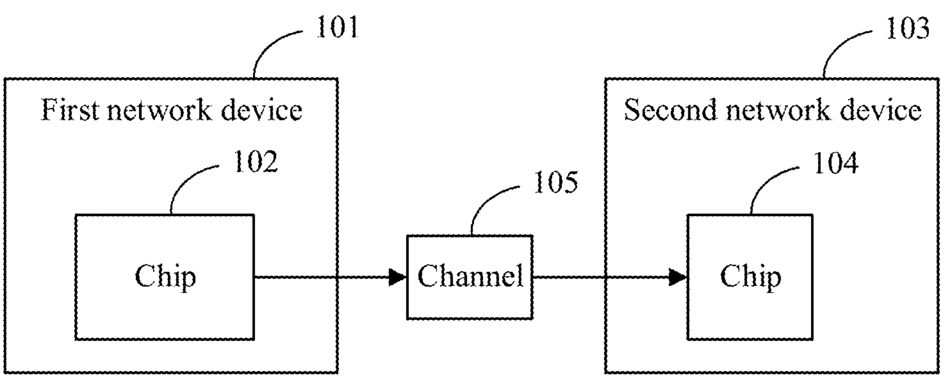

FIG. 1

201 — Obtain $2^n$ groups of code stream blocks, where any group of code stream blocks includes a control block and a data block, and n is an integer greater than 1

↓

202 — Perform first encoding on the $2^n$ groups of code stream blocks to obtain a target code block, where the target code block includes a type determined based on control blocks of the $2^n$ groups of code stream blocks and a data unit determined based on the control blocks and data blocks of the $2^n$ groups of code stream blocks

FIG. 2

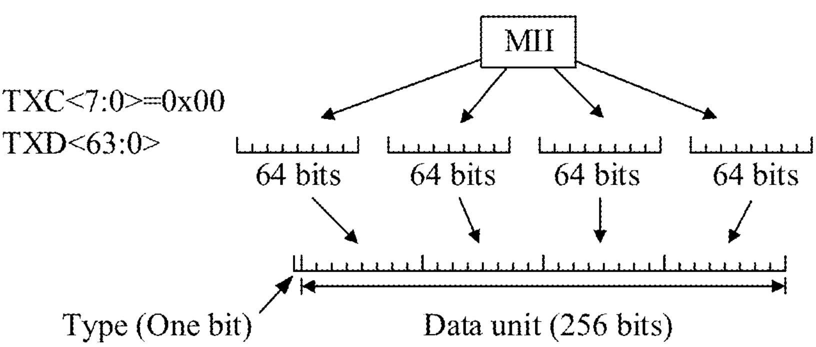

FIG. 3

| Type | Data unit | | | |
|---|---|---|---|---|
| 1 | D0 | D1 | D2 | D3 |

FIG. 4

<table>
<tr><th></th><th></th><th></th><th></th><th></th><th>Type</th><th colspan="4">Type indication</th><th colspan="35">Code block content</th></tr>
<tr><th></th><th>0</th><th>1</th><th>2</th><th>3</th><th>1b</th><th>1b</th><th>1b</th><th>1b</th><th>1b</th><th>4b</th><th>8b</th><th>8b</th><th>8b</th><th>8b</th><th>8b</th><th>8b</th><th>8b</th><th>4b</th><th>4b</th><th>8b</th><th>8b</th><th>8b</th><th>8b</th><th>8b</th><th>8b</th><th>8b</th><th>4b</th><th>4b</th><th>8b</th><th>8b</th><th>8b</th><th>8b</th><th>8b</th><th>8b</th><th>8b</th><th>4b</th><th>4b</th><th>8b</th><th>8b</th><th>8b</th><th>8b</th><th>8b</th><th>8b</th><th>8b</th></tr>
<tr><td>Case 1</td><td>C</td><td>C</td><td>C</td><td>C</td><td>0</td><td>0</td><td>0</td><td>0</td><td>0</td><td>f_0</td><td colspan="7">C0</td><td colspan="2">BTF1</td><td colspan="7">C1</td><td colspan="2">BTF2</td><td colspan="7">C2</td><td colspan="2">BTF3</td><td colspan="7">C3</td></tr>
<tr><td>Case 2</td><td>D</td><td>C</td><td>C</td><td>C</td><td>0</td><td>1</td><td>0</td><td>0</td><td>0</td><td colspan="9">D0</td><td>f_1</td><td colspan="7">C1</td><td colspan="2">BTF2</td><td colspan="7">C2</td><td colspan="2">BTF3</td><td colspan="7">C3</td></tr>
<tr><td>Case 3</td><td>C</td><td>D</td><td>C</td><td>C</td><td>0</td><td>0</td><td>1</td><td>0</td><td>0</td><td>f_0</td><td colspan="7">C0</td><td colspan="9">D1</td><td colspan="2">BTF2</td><td colspan="7">C2</td><td colspan="2">BTF3</td><td colspan="7">C3</td></tr>
<tr><td>Case 4</td><td>D</td><td>D</td><td>C</td><td>C</td><td>0</td><td>1</td><td>1</td><td>0</td><td>0</td><td colspan="9">D0</td><td colspan="9">D1</td><td>f_2</td><td colspan="7">C2</td><td colspan="2">BTF3</td><td colspan="7">C3</td></tr>
<tr><td>Case 5</td><td>C</td><td>C</td><td>D</td><td>C</td><td>0</td><td>0</td><td>0</td><td>1</td><td>0</td><td>f_0</td><td colspan="7">C0</td><td colspan="2">BTF1</td><td colspan="7">C1</td><td colspan="9">D2</td><td colspan="2">BTF3</td><td colspan="7">C3</td></tr>
<tr><td>Case 6</td><td>D</td><td>C</td><td>D</td><td>C</td><td>0</td><td>1</td><td>0</td><td>1</td><td>0</td><td colspan="9">D0</td><td>f_1</td><td colspan="7">C1</td><td colspan="9">D2</td><td colspan="2">BTF3</td><td colspan="7">C3</td></tr>
<tr><td>Case 7</td><td>C</td><td>D</td><td>D</td><td>C</td><td>0</td><td>0</td><td>1</td><td>1</td><td>0</td><td>f_0</td><td colspan="7">C0</td><td colspan="9">D1</td><td colspan="9">D2</td><td colspan="2">BTF3</td><td colspan="7">C3</td></tr>
<tr><td>Case 8</td><td>D</td><td>D</td><td>D</td><td>C</td><td>0</td><td>1</td><td>1</td><td>1</td><td>0</td><td colspan="9">D0</td><td colspan="9">D1</td><td colspan="9">D2</td><td>f_3</td><td colspan="7">C3</td></tr>
<tr><td>Case 9</td><td>C</td><td>C</td><td>C</td><td>D</td><td>0</td><td>0</td><td>0</td><td>0</td><td>1</td><td>f_0</td><td colspan="7">C0</td><td colspan="2">BTF1</td><td colspan="7">C1</td><td colspan="2">BTF2</td><td colspan="7">C2</td><td colspan="9">D3</td></tr>
<tr><td>Case 10</td><td>D</td><td>C</td><td>C</td><td>D</td><td>0</td><td>1</td><td>0</td><td>0</td><td>1</td><td colspan="9">D0</td><td>f_1</td><td colspan="7">C1</td><td colspan="2">BTF2</td><td colspan="7">C2</td><td colspan="9">D3</td></tr>
<tr><td>Case 11</td><td>C</td><td>D</td><td>C</td><td>D</td><td>0</td><td>0</td><td>1</td><td>0</td><td>1</td><td>f_0</td><td colspan="7">C0</td><td colspan="9">D1</td><td colspan="2">BTF2</td><td colspan="7">C2</td><td colspan="9">D3</td></tr>
<tr><td>Case 12</td><td>D</td><td>D</td><td>C</td><td>D</td><td>0</td><td>1</td><td>1</td><td>0</td><td>1</td><td colspan="9">D0</td><td colspan="9">D1</td><td>f_2</td><td colspan="7">C2</td><td colspan="9">D3</td></tr>
<tr><td>Case 13</td><td>C</td><td>C</td><td>D</td><td>D</td><td>0</td><td>0</td><td>0</td><td>1</td><td>1</td><td>f_0</td><td colspan="7">C0</td><td colspan="2">BTF1</td><td colspan="7">C1</td><td colspan="9">D2</td><td colspan="9">D3</td></tr>
<tr><td>Case 14</td><td>D</td><td>C</td><td>D</td><td>D</td><td>0</td><td>1</td><td>0</td><td>1</td><td>1</td><td colspan="9">D0</td><td>f_1</td><td colspan="7">C1</td><td colspan="9">D2</td><td colspan="9">D3</td></tr>
<tr><td>Case 15</td><td>C</td><td>D</td><td>D</td><td>D</td><td>0</td><td>0</td><td>1</td><td>1</td><td>1</td><td>f_0</td><td colspan="7">C0</td><td colspan="9">D1</td><td colspan="9">D2</td><td colspan="9">D3</td></tr>
</table>

FIG. 5

| 0 | 1 | 2 | 3 |
|---|---|---|---|
| E | E | E | E |

| Type | Type indication | | | | Code block content | | | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|---|---|---|---|---|---|
| 1b | 1b | 1b | 1b | 1b | 4b | 8b | 8b | 8b | 8b | 8b | 8b | 8b | 4b | 4b | 8b | 8b | 8b | 8b | 8b | 8b | 8b | 4b | 4b | 8b | 8b | 8b | 8b | 8b | 8b | 8b | 4b | 4b | 8b | 8b | 8b | 8b | 8b | 8b | 8b |
| 0 | 1 | 1 | 1 | 1 | E0 | | | | | | | | E1 | | | | | | | | | E2 | | | | | | | | | E3 | | | | | | | | |

FIG. 6

ENCODING METHOD, DECODING METHOD, APPARATUS, DEVICE, SYSTEM, AND READABLE STORAGE MEDIUM

CROSS-REFERENCE TO RELATED APPLICATIONS

This application is a continuation of International Application No. PCT/CN2022/142363, filed on Dec. 27, 2022, which claims priority to Chinese Patent Application No. 202210005434.5, filed on Jan. 5, 2022, and Chinese Patent Application No. 202210114840.5, filed on Jan. 30, 2022. All of the aforementioned applications are hereby incorporated by reference in their entireties.

TECHNICAL FIELD

This application relates to the field of communication technologies, and in particular, to an encoding method, a decoding method, an apparatus, a device, a system, and a readable storage medium.

BACKGROUND

With development of communication technologies, a manner of packet transmission over an ethernet is increasingly refined. During packet transmission, a packet from a media access control (MAC) layer is divided into blocks based on a fixed length and then the blocks enter an media independent interface (MII) in parallel. For example, a packet is divided into blocks and then the blocks enter an 800 gigabit (G) MII in parallel, where the 800G MII represents an MII operating at a MAC rate of 800 gigabits per second (Gb/s). The blocks are transmitted to a physical coding sublayer (PCS) through the MII. A code stream block received by the PCS from the MII includes a data block (TXD) and a control block (TXC). The TXC and the TXD are obtained by processing, through a reconciliation sublayer (RS), packet flow content from the MAC layer. The TXC is a control character, and identifies whether content of a corresponding byte in the TXD is a control signal or a data signal, where the control signal includes information such as a start, termination, an error, and idleness of the packet. The PCS performs encoding based on content of the TXC/TXD, to reduce overheads and provide synchronization and protection functions.

In a related technology, a PCS performs 64-bit (B)/66B encoding on each group of code stream blocks from an MII, to obtain a 66-bit code block, where the 66-bit code block is a data code block or a control code block. If the 66-bit code block is a control code block, the 66-bit code block includes a field with 4-bit Hamming distance protection. When data transmission is performed by using a high-speed physical link, every four 66-bit code blocks are transcoded into one 256B/257B encoded block whose length is 257 bits, forward error correction (FEC) encoding is performed on the 257-bit code block, to perform transmission of FEC codewords obtained through the FEC encoding.

When an uncorrectable FEC codeword exists, because a quantity of error bits in the FEC codeword is large and locations of the error bits are not fixed, reliable error bit identification cannot be ensured by using the field with Hamming distance protection in the 66-bit code block. In addition, because the reliable error bit identification may be implemented through FEC error indication, error bit identification does not need to be implemented by using the field with Hamming distance protection in the 66-bit code block.

On this basis, because most processing at the PCS is based on the 257-bit code block, a 64B/66B encoding process is not required any more. If the 64B/66B encoding process is retained, a subsequent transcoding process will cause delay, power consumption, and chip area occupation.

SUMMARY

This application provides an encoding method, a decoding method, an apparatus, a device, a system, and a readable storage medium, to improve encoding and decoding efficiency.

According to a first aspect, an encoding method is provided. The method includes: obtaining $2^n$ groups of code stream blocks, where any group of code stream blocks includes a control block and a data block, and n is an integer greater than 1; and performing first encoding on the $2^n$ groups of code stream blocks to obtain a target code block, where the target code block includes a type determined based on control blocks in the $2^n$ groups of code stream blocks and a data unit determined based on the control blocks and data blocks in the $2^n$ groups of code stream blocks.

The target code block can be obtained by performing the first encoding on the $2^n$ groups of code stream blocks including the control blocks and the data blocks, without a need of performing 64B/66B encoding on each group of the $2^n$ groups of code stream blocks to obtain $2^n$ 66-bit code blocks and transcoding the $2^n$ 66-bit code blocks, so that encoding efficiency is improved, and a delay, power consumption, and chip area occupation that are caused by an encoding process are reduced.

In a possible implementation, the type indicates that the target code block is a data code block; and the data unit is obtained by performing the first encoding on the data blocks in the $2^n$ groups of code stream blocks in a sequence of the $2^n$ groups of code stream blocks.

In a possible implementation, the type indicates that the target code block is a control code block; and the data unit includes a type indication and code block content, the code block content is obtained by performing the first encoding on the data blocks in the $2^n$ groups of code stream blocks in a sequence determined based on the control blocks and the data blocks in the $2^n$ groups of code stream blocks, the type indication is obtained based on the control blocks in the $2^n$ groups of code stream blocks, and the type indication indicates a type of each group of code stream blocks.

In a possible implementation, the target code block is an error code block, and the error code block includes error indication data. According to the encoding method in this application, the first encoding can be performed on different types of code stream blocks to obtain the target code block. Therefore, the method is widely applied.

In a possible implementation, the target code block is obtained by processing the $2^n$ groups of code stream blocks based on an error detection result, and the error detection result is obtained based on the control blocks and the data blocks in the $2^n$ groups of code stream blocks. A code stream block in which the error occurs is processed to obtain the target code block, so that error data can be distinguished from correct data in subsequent data transmission, to ensure data reliability.

In a possible implementation, the error detection result includes a content sequence error or content error of the $2^n$ groups of code stream blocks, the target code block is obtained by performing the first encoding based on a code stream block that has a correct content sequence and correct content and an error block in the $2^n$ groups of code stream blocks, and the error block is obtained based on a code stream block that has a content sequence error or content error in the $2^n$ groups of code stream blocks.

In a possible implementation, the control block includes m bits, the data block includes 8m bits, and m is a positive integer.

In a possible implementation, a value of n is 2, a value of m is 8, and the target code block is 257 bits.

In a possible implementation, all of the $2^n$ groups of code stream blocks are from a media independent interface MII.

In a possible implementation, after obtaining the target code block, the method further includes: performing second encoding on the target code block based on an FEC code type, to obtain first data; and sending the first data. The second encoding is performed on the target code block based on the FEC code type to obtain the first data, so that a receive end can perform error correction on the received first data, to ensure data transmission accuracy.

According to a second aspect, a decoding method is provided. The method includes: obtaining a target code block, where the target code block includes a type and a data unit; and performing first decoding on the target code block based on the type and the data unit of the target code block, to obtain $2^n$ groups of code stream blocks, where any group of code stream blocks includes a control block and a data block that are obtained based on the type and the data unit, and n is an integer greater than 1.

Because the $2^n$ groups of code stream blocks including the control blocks and the data blocks can be obtained by performing the first decoding on the target code block, without a need of transcoding the target code block to obtain $2^n$ 66-bit code blocks and decoding the $2^n$ 66-bit code blocks, so that decoding efficiency is improved, and a delay, power consumption, and chip area occupation that are caused by a decoding process are reduced.

In a possible implementation, the type indicates that the target code block is a data code block; and a data block included in group i of code stream blocks in the $2^n$ groups of code stream blocks is obtained by performing the first decoding on content, in the data unit, that corresponds to group i of code stream blocks and that has a length of 8m, where m is a positive integer, and i is an integer greater than or equal to 1 and less than or equal to $2^n$, or i is an integer greater than or equal to 0 and less than or equal to $2^n-1$.

In a possible implementation, the type indicates that the target code block is a control code block, the data unit includes a type indication and code block content, the type indication includes $2^n$ bits, one bit in the $2^n$ bits indicates a type of one group of code stream blocks that corresponds to the bit and that is in the $2^n$ groups of code stream blocks, and the code block content includes $2^n$ bit groups;

a control block included in group i of code stream blocks in the $2^n$ groups of code stream blocks is obtained based on the type, a bit that corresponds to group i of code stream blocks and that is in the type indication, and a bit group that corresponds to group i of code stream blocks and that is in the code block content, where i is an integer greater than or equal to 1 and less than or equal to $2^n$, or i is an integer greater than or equal to 0 and less than or equal to $2^n-1$; and the data block included in group i of code stream blocks in the $2^n$ groups of code stream blocks is obtained by performing, based on the bit that corresponds to group i of code stream blocks and that is in the type indication, the first decoding on the bit group that corresponds to group i of code stream blocks and that is in the code block content.

In a possible implementation, the $2^n$ bit groups include a first bit group and $2^n-1$ second bit groups, and a quantity of bits included in the first bit group is different from a quantity of bits included in the second bit group.

In a possible implementation, the data unit includes a type indication, and the type and the type indication indicate that the target code block is an error code block; and a control block included in each group of the $2^n$ groups of code stream blocks is a first value, a data block included in each group of the $2^n$ groups of code stream blocks is a second value, and the first value and the second value indicate that the code stream block is an error code stream block.

According to the decoding method in this application, the first decoding can be performed on different types of target code blocks to obtain $2^n$ groups of code stream blocks. Therefore, the method is widely applied.

In a possible implementation, the obtaining a target code block includes: receiving second data, where the second data is obtained based on first data that is encoded by using a forward error correction FEC code type; and performing second decoding on the second data to obtain the target code block, where the second decoding is error correction processing.

In a possible implementation, the target code block is an error code block obtained when error correction is performed on the second data, but the error correction fails. The target code block is a code block obtained when error correction is performed on the second data, but the error correction fails, and error indication on a code block in an FEC codeword, so that a receive end can determine that data obtained based on the target code block is error data, to ensure data accuracy.

In a possible implementation, the obtaining a target code block includes: receiving second data, where the second data is obtained based on first data that is encoded by using a forward error correction FEC code type; and performing second decoding on the second data to obtain the target code block, where the second decoding is error detection processing with error correction bypassed.

In a possible implementation, the target code block is an error code block obtained when an error is detected from the second data but error correction is bypassed.

For the decoding method provided in this application, the second decoding operation may be performing error correction or performing error detection with error correction bypassed on a codeword. When error correction is performed on a codeword in a second decoding process, if it is determined that error correction cannot be performed on a current codeword (for example, a quantity of errors exceeds an error correction capability), error indication needs to be performed on all code blocks in the codeword; or when only error detection with error correction bypassed is performed on a codeword in a second decoding process, error indication needs to be performed on all code blocks in a codeword for which an error is detected.

In a possible implementation, the $2^n$ groups of code stream blocks are obtained by performing the first decoding on the target code block based on an error detection result and the type and the data unit of the target code block, and the error detection result is obtained based on the type and the data unit of the target code block. The target code block in which the error occurs is processed, so that a receive end can distinguish between error data and correct data, to ensure data reliability.

In a possible implementation, the error detection result includes a content sequence error or content error of the target code block, the $2^n$ groups of code stream blocks are obtained by performing the first decoding on a second code block based on a type and a data unit of the second code block, and the second code block is a code block that is obtained by converting the target code block and that has a same quantity of bits as the target code block.

In a possible implementation, the error detection result includes a content sequence error or content error of the target code block, the $2^n$ groups of code stream blocks are obtained by converting $2^n$ groups of first code stream blocks, and the $2^n$ groups of first code stream blocks are obtained by performing the first decoding on the target code block based on the type and the data unit of the target code block.

In a possible implementation, the control block includes m bits, the data block includes 8m bits, and m is a positive integer.

In a possible implementation, a value of n is 2, a value of m is 8, and the target code block is 257 bits.

In a possible implementation, all of the $2^n$ groups of code stream blocks are in a media independent interface MII format.

According to a third aspect, an encoding apparatus is provided. The apparatus includes:

- an obtaining module, configured to obtain $2^n$ groups of code stream blocks, where any group of code stream blocks includes a control block and a data block, and n is an integer greater than 1; and
- a first encoding module, configured to perform first encoding on the $2^n$ groups of code stream blocks to obtain a target code block, where the target code block includes a type determined based on control blocks in the $2^n$ groups of code stream blocks and a data unit determined based on the control blocks and data blocks in the $2^n$ groups of code stream blocks.

In a possible implementation, the type indicates that the target code block is a data code block; and the data unit is obtained by performing the first encoding on the data blocks in the $2^n$ groups of code stream blocks in a sequence determined based on the control blocks and the data blocks in the $2^n$ groups of code stream blocks.

In a possible implementation, the type indicates that the target code block is a control code block; and the data unit includes a type indication and code block content, the code block content is obtained by performing the first encoding on the data blocks in the $2^n$ groups of code stream blocks in a sequence determined based on the control blocks and the data blocks in the $2^n$ groups of code stream blocks, the type indication is obtained based on the control blocks in the $2^n$ groups of code stream blocks, and the type indication indicates a type of each group of code stream blocks.

In a possible implementation, the target code block is an error code block, and the error code block includes error indication data.

In a possible implementation, the target code block is obtained by processing the $2^n$ groups of code stream blocks based on an error detection result, and the error detection result is obtained based on the control blocks and the data blocks in the $2^n$ groups of code stream blocks.

In a possible implementation, the error detection result includes a content sequence error or content error of the $2^n$ groups of code stream blocks, the target code block is obtained by performing the first encoding based on a code stream block that has a correct content sequence and correct content and an error block in the $2^n$ groups of code stream blocks, and the error block is obtained based on a code stream block that has a content sequence error or content error in the $2^n$ groups of code stream blocks.

In a possible implementation, the control block includes m bits, the data block includes 8m bits, and m is a positive integer.

In a possible implementation, a value of n is 2, a value of m is 8, and the target code block is 257 bits.

In a possible implementation, all of the $2^n$ groups of code stream blocks are from a media independent interface MII.

In a possible implementation, the apparatus further includes:

- a second encoding module, configured to perform second encoding on the target code block based on a forward error correction FEC code type, to obtain first data; and
- a sending module, configured to send the first data.

According to a fourth aspect, a decoding apparatus is provided. The apparatus includes:

- an obtaining module, configured to obtain a target code block, where the target code block includes a type and a data unit; and
- a decoding module, configured to perform first decoding on the target code block based on the type and the data unit of the target code block, to obtain $2^n$ groups of code stream blocks, where any group of code stream blocks includes a control block and a data block that are obtained based on the type and the data unit, and n is an integer greater than 1.

In a possible implementation, the type indicates that the target code block is a data code block; and a data block included in group i of code stream blocks in the $2^n$ groups of code stream blocks is obtained by performing the first decoding on content, in the data unit, that corresponds to group i of code stream blocks and that has a length of 8m, where m is a positive integer, and i is an integer greater than or equal to 1 and less than or equal to $2^n$, or i is an integer greater than or equal to 0 and less than or equal to $2^n-1$.

In a possible implementation, the type indicates that the target code block is a control code block, the data unit includes a type indication and code block content, the type indication includes $2^n$ bits, one bit in the $2^n$ bits indicates a type of one group of code stream blocks that corresponds to the bit and that is in the $2^n$ groups of code stream blocks, and the code block content includes $2^n$ bit groups; a control block included in group i of code stream blocks in the $2^n$ groups of code stream blocks is obtained based on the type, a bit that corresponds to group i of code stream blocks and that is in the type indication, and a bit group that corresponds to group i of code stream blocks and that is in the code block content, where i is an integer greater than or equal to 1 and less than or equal to $2^n$, or i is an integer greater than or equal to 0 and less than or equal to $2^n-1$; and the data block included in group i of code stream blocks in the $2^n$ groups of code stream blocks is obtained by performing, based on the bit that corresponds to group i of code stream blocks and that is in the type indication, the first decoding on the bit group that corresponds to group i of code stream blocks and that is in the code block content.

In a possible implementation, the $2^n$ bit groups include a first bit group and $2^n-1$ second bit groups, and a quantity of bits included in the first bit group is different from a quantity of bits included in the second bit group.

In a possible implementation, the data unit includes a type indication, and the type and the type indication indicate that the target code block is an error code block; and a control block included in each group of the $2^n$ groups of code stream blocks is a first value, a data block included in each group of the $2^n$ groups of code stream blocks is a second value, and the first value and the second value indicate that the code stream block is an error code stream block.

In a possible implementation, the obtaining module is configured to: receive second data, where the second data is obtained based on first data that is encoded by using a forward error correction FEC code type; and perform second decoding on the second data to obtain the target code block, where the second decoding is error correction processing.

In a possible implementation, the target code block is a code block obtained when error correction is performed on the second data but the error correction fails.

In a possible implementation, the obtaining module is configured to: receive second data, where the second data is obtained based on first data that is encoded by using a forward error correction FEC code type; and perform second decoding on the second data to obtain the target code block, where the second decoding is error detection processing with error correction bypassed.

In a possible implementation, the target code block is an error code block obtained when an error is detected from the second data but error correction is bypassed.

In a possible implementation, the $2^n$ groups of code stream blocks are obtained by performing the first decoding on the target code block based on an error detection result and the type and the data unit of the target code block, and the error detection result is obtained based on the type and the data unit of the target code block.

In a possible implementation, the error detection result includes a content sequence error or content error of the target code block, the $2^n$ groups of code stream blocks are obtained by performing the first decoding on a second code block based on a type and a data unit of the second code block, and the second code block is a code block that is obtained by converting the target code block and that has a same quantity of bits as the target code block.

In a possible implementation, the error detection result includes a content sequence error or content error of the target code block, the $2^n$ groups of code stream blocks are obtained by converting $2^n$ groups of first code stream blocks, and the $2^n$ groups of first code stream blocks are obtained by performing the first decoding on the target code block based on the type and the data unit of the target code block.

In a possible implementation, the control block includes m bits, the data block includes 8m bits, and m is a positive integer.

In a possible implementation, a value of n is 2, a value of m is 8, and the target code block is 257 bits.

In a possible implementation, all of the $2^n$ groups of code stream blocks are in a media independent interface MII format.

According to a fifth aspect, a network device is provided. The network device includes a processor, where the processor is coupled to a memory, the memory stores at least one program instruction or code, and the at least one program instruction or code is loaded and executed by the processor, to enable the network device to implement the encoding method according to any one of the first aspect or the possible implementations of the first aspect, or the decoding method according to any one of the second aspect or the possible implementations of the second aspect.

According to a sixth aspect, a computer-readable storage medium is provided. The storage medium stores at least one program instruction or code. When the program instruction or the code is loaded and executed by a processor, a computer is enabled to implement the encoding method according to any one of the first aspect or the possible implementations of the first aspect, or the decoding method according to any one of the second aspect or the possible implementations of the second aspect.

According to a seventh aspect, a communication system is provided. The system includes a first network device and a second network device, the first network device is configured to perform the encoding method according to any one of the first aspect or the possible implementations of the first aspect, and the second network device is configured to perform the decoding method according to any one of the second aspect or the possible implementations of the second aspect.

According to an eighth aspect, another communications apparatus is provided, and the apparatus includes a transceiver, a memory, and a processor. The transceiver, the memory, and the processor communicate with each other through an internal connection path. The memory is configured to store instructions. The processor is configured to execute the instructions stored in the memory, to control the transceiver to receive a signal and control the transceiver to send a signal. In addition, when the processor executes the instructions stored in the memory, the processor is enabled to perform the encoding method according to any one of the first aspect or the possible implementations of the first aspect, or the decoding method according to any one of the second aspect or the possible implementations of the second aspect.

For example, there is one or more processors, and there is one or more memories.

For example, the memory may be integrated with the processor, or the memory and the processor are separately disposed.

In an implementation process, the memory may be a non-transitory memory, for example, a read-only memory (ROM). The memory and the processor may be integrated on a same chip, or may be separately disposed on different chips. A type of the memory and a manner of disposing the memory and the processor are not limited in this application.

According to a ninth aspect, a computer program product is provided. The computer program product includes computer program code. When the computer program code is run on a computer, the computer is enabled to perform the encoding method according to any one of the first aspect or the possible implementations of the first aspect, or the decoding method according to any one of the second aspect or the possible implementations of the second aspect.

According to a tenth aspect, a chip is provided. The chip includes a processor, configured to: invoke instructions from a memory, and run the instructions stored in the memory, to enable a communication device in which the chip is installed to perform the encoding method according to any one of the first aspect or the possible implementations of the first aspect, or the decoding method according to any one of the second aspect or the possible implementations of the second aspect.

According to an eleventh aspect, another chip is provided. The chip includes an input interface, an output interface, a processor, and a memory. The input interface, the output interface, the processor, and the memory are connected through an internal connection path. The processor is configured to execute code in the memory. When the code is executed, the processor is configured to perform the encoding method according to any one of the first aspect or the possible implementations of the first aspect, or the decoding method according to any one of the second aspect or the possible implementations of the second aspect.

BRIEF DESCRIPTION OF DRAWINGS

FIG. 1 is a schematic diagram of an implementation environment for an encoding method and a decoding method according to an embodiment of this application;

FIG. 2 is a flowchart of an encoding method according to an embodiment of this application;

FIG. 3 is a schematic diagram of a process of obtaining a target code block according to an embodiment of this application;

FIG. 4 is a schematic diagram of a structure of a target code block according to an embodiment of this application;

FIG. 5 is a schematic diagram of a structure of another target code block according to an embodiment of this application;

FIG. 6 is a schematic diagram of a structure of another target code block according to an embodiment of this application;

DESCRIPTION OF EMBODIMENTS

Figure 7:
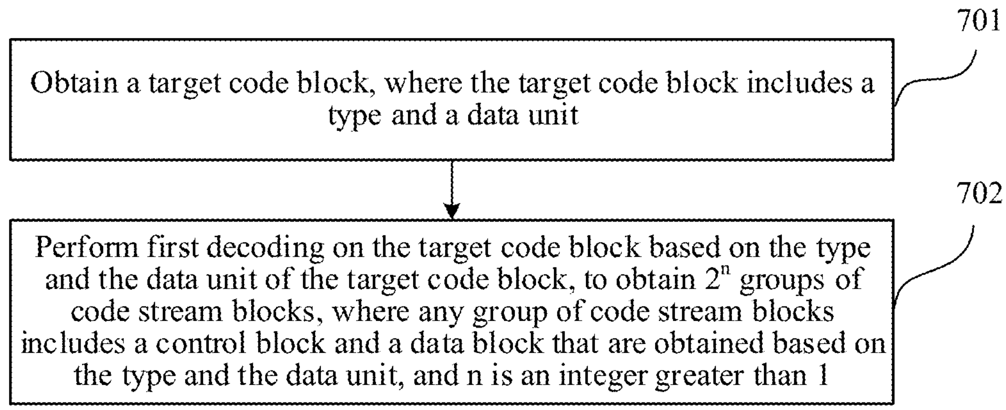
FIG. 7 is a flowchart of a decoding method according to an embodiment of this application.

Terms used in implementations of this application are only used to explain embodiments of this application, and are not intended to limit this application. The following describes embodiments of this application with reference to the accompanying drawings.

As a local area network technology, an ethernet is increasingly widely applied. Since a 100 gigabit ethernet (GE), data transmission is performed at a transmission rate of 25 Gb/s for a single lane. To correct an error bit in received data, FEC encoding is introduced to a physical layer, to perform transmission of FEC codewords obtained through the encoding. For example, when data transmission is performed through a 100G lane, a transmit end may perform FEC encoding on original data by using Reed-Solomon (RS) (528, 514), and one RS codeword block obtained through the encoding includes a 5140-bit payload and a 140-bit check code. Due to existence of a check code, for a transmission rate needed for transmitting a same payload within same time, a transmission rate needed for FEC codeword transmission is higher than a transmission rate needed for original data transmission.

To reduce the transmission rate needed for the FEC codeword transmission, transcoding is used in an ethernet standard, to reduce overheads of a code block before FEC encoding, so as to reduce the transmission rate needed for the FEC codeword transmission. For example, every four 64B/66B encoded blocks are transcoded into one 256B/257B encoded block. Because overheads of one 257-bit code block are lower than overheads of four 66-bit code blocks, a transmission rate that is needed for FEC codeword transmission and that is obtained based on the 257-bit code block is lower. When data transmission is performed through a 100G lane, a transmission rate that is needed for FEC codeword transmission and that is obtained based on transcoded code block transmission is 103.125 Gb/s, and the transmission rate is the same as a transmission rate needed for transmission of a 66-bit code block on which FEC encoding is not performed.

After obtaining the FEC codewords, the receive end may perform error correction on the FEC codewords. Error bit identification may be implemented through FEC error indication, and most processing at a PCS is performed based on a 257-bit code block. Therefore, a 64B/66B encoding process and a corresponding transcoding process cause a delay, power consumption, and chip area occupation.

Therefore, embodiments of this application provide a data transmission method, to resolve the foregoing problem. In embodiments of this application, a target code block is obtained by performing first encoding on $2^n$ (n is an integer greater than 1) groups of code stream blocks including control blocks and data blocks, without a need of performing 64B/66B encoding on each group of the $2^n$ groups of code stream blocks to obtain $2^n$ 66-bit code blocks and transcoding the $2^n$ 66-bit code blocks. Therefore, encoding efficiency is improved, and a delay, power consumption, and chip area occupation caused by the encoding process are reduced.

According to the method provided in embodiments of this application, when first decoding is performed on a target code block, $2^n$ groups of code stream blocks including control blocks and data blocks may be obtained by directly performing the first decoding on the target code block, without a need of transcoding the target code block to obtain $2^n$ 66-bit code blocks and decoding the $2^n$ 66-bit code blocks. Therefore, decoding efficiency is improved, and a delay, power consumption, and chip area occupation caused by the decoding process are reduced.

The encoding method and the decoding method provided in embodiments of this application are applicable to a current ethernet interface scenario or another scenario in which data transmission is needed. An implementation scenario shown in FIG. 1 is used as an example. The implementation scenario includes a plurality of chips, and information can be exchanged between the chips to implement data transmission. For example, a chip 102 is disposed in a first network device 101, a chip 104 is disposed in a second network device 103, both the chip 102 and the chip 104 support FEC encoding and FEC decoding, and a channel 105 between the first network device 101 and the second network device 103 can be used for transmission of FEC encoded data. In this case, the chip 102 may perform first encoding on $2^n$ groups of code stream blocks to obtain a target code block, perform second encoding on the target code block based on a first FEC code type to obtain first data, and send the first data to the chip 104 through the channel 105. For example, an error bit may occur during transmission of the first data through the channel 105, and received data is referred to as second data. After receiving the second data, the chip 104 may perform second decoding on the second data by using the first FEC code type to obtain the target code block, and perform first decoding on the target code block to obtain the $2^n$ groups of code stream blocks. n is an integer greater than 1, and the first FEC code type includes but is not limited to any one or a cascaded combination of a plurality of an RS code, a Bose-Chaudhuri-Hocquenghem (BCH) code, a Hamming code, an extended-BCH code, an extended-Hamming code, a fire code, a turbo code, a turbo product code (TPC), a staircase code, and a low-density parity check (LDPC) code.

It may be understood that the implementation scenario shown in FIG. 1 may include a plurality of network devices, and each network device may include at least one chip. In FIG. 1, only an example in which there are two network devices and each network device includes one chip is used for description.

With reference to the implementation scenario shown in FIG. 1, an encoding method provided in an embodiment of this application is shown in FIG. 2. For example, the encoding method provided in this embodiment of this application is performed by the chip 102 in FIG. 1, and the method includes but is not limited to operation 201 and operation 202.

Operation 201: Obtain $2^n$ groups of code stream blocks, where any group of code stream blocks includes a control block and a data block, and n is an integer greater than 1.

In a possible implementation, all of the $2^n$ groups of code stream blocks are from an MII. A manner of obtaining the $2^n$ groups of code stream blocks based on the MII is not limited in this embodiment of this application. For example, the MII may be an MII defined in the institute of electrical and electronics engineers (IEEE) 802.3 standard, for example, the IEEE 802.3-2018 and another version of the IEEE 802.3 standard, for obtaining the $2^n$ groups of code stream blocks. For example, for a value of n is 2, four groups of code stream blocks are obtained.

For example, for any group of the $2^n$ groups of code stream blocks, the control block in the any group of code stream blocks includes m bits, the data block in the any group of code stream blocks includes 8m bits, and m is a positive integer, where 8m represents eight times of m, and 8m may alternatively be represented as 8*m. For example, for a value of m is 8, for any group of code stream blocks, the control block in the any group of code stream blocks includes eight bits, and the data block in the any group of code stream blocks includes 64 bits. In a possible implementation, the m bits included in the control block are all control bits, in other words, the control block includes m control bits; and the 8m bits included in the data block are all data, in other words, the data block includes 8m-bit data.

For example, a control block including eight control bits is represented as TXC<7:0>, a data block including 64-bit data is represented as TXD<63:0>, and a sequence of all bits of the control block and the data block is from a most significant bit (MSB) to a least significant bit (LSB).

Operation 202: Perform first encoding on the $2^n$ groups of code stream blocks to obtain a target code block, where the target code block includes a type determined based on control blocks in the $2^n$ groups of code stream blocks and a data unit determined based on the control blocks and data blocks in the $2^n$ groups of code stream blocks.

For example, in each group of code stream blocks, each control block is eight bits, and each data block is 64 bits. The first encoding is performed on four groups of code stream blocks to obtain one 257-bit target code block. In this embodiment of this application, n=2 is used as an example for description. When n is another value, the first encoding may be performed on every four groups of code stream blocks, to obtain a plurality of target code blocks. For example, for n=3, eight groups of code stream blocks are obtained. The first encoding may be performed on the first four groups of code stream blocks to obtain one target code block, and the first encoding may be performed on the last four groups of code stream blocks to obtain one target code block.

In a possible implementation, the performing first encoding on the $2^n$ groups of code stream blocks to obtain a target code block includes but is not limited to the following encoding manner 1 and encoding manner 2.

In the encoding manner 1: a type of the target code block is determined as a data code block based on the control blocks in the $2^n$ groups of code stream blocks; the first encoding is performed on the data blocks in the $2^n$ groups of code stream blocks in a sequence of the $2^n$ groups of code stream blocks, to obtain the data unit; and the target code block is obtained based on the type and the data unit.

For example, for the target code block obtained in the encoding manner 1, the type indicates that the target code block is the data code block; and the data unit is obtained by performing the first encoding on the data blocks in the $2^n$ groups of code stream blocks in the sequence of the $2^n$ groups of code stream blocks.

In a possible implementation, when each of the control blocks in the $2^n$ groups of code stream blocks is a first specified value, it is determined that the type of the target code block is the data code block. The first specified value indicates that a type of the code stream block is a data code stream block. For example, the control block in each group of code stream blocks is represented as TXC<7:0>, and the first specified value is 0x00. When TXC<7:0> of each group of code stream blocks is 0x00, a type of each group of code stream blocks is a data code stream block.

In a possible implementation, that the first encoding is performed on the data blocks in the $2^n$ groups of code stream blocks in a sequence of the $2^n$ groups of code stream blocks, to obtain the data unit includes: separately using, in the sequence of the $2^n$ groups of code stream blocks, bits included in the data blocks in the $2^n$ groups of code stream blocks as bits of the data unit, to obtain the data unit.

For example, j represents a sequence number of one group of four groups of code stream blocks, where j=0, 1, 2, or 3. TXD_j<63:0> represents a data block in group j of code stream blocks, tx_coded<256:0> represents a target code block, tx_coded<0> represents a type of the target code block, and tx_coded<(64j+64):(64j+1)> represents bit (64j+64) to bit (64j+1) of the target code block. In this case, each bit of tx_coded<256:0> is denoted in the following expression 1 and expression 2:

$$\text{tx\_coded} < 0 >= 1 \qquad \text{(Expression 1)}$$

$$\text{tx\_coded} < (64j+64):(64j+1) >= \text{TXD\_j} < 63:0 >, \qquad \text{(Expression 2)}$$

$$\text{where } j = 0, 1, 2, \text{ or } 3$$

In the expression 1, tx_coded<0>=1 represents that the type is a data code block. In the expression 2, tx_coded<(64j+64):(64j+1)>=TXD_j<63:0> represents that a plurality of bits of a data block in each group of code stream blocks are respectively used as a plurality of bits of a data unit.

For example, when j=0, tx_coded<64:1>=TXD_0<63:0> represents that bit 63 to bit 0 of a data block in group 0 of code stream blocks are respectively used as bit 64 to bit 1 of the target code block. When j=1, tx_coded<128:65>=TXD_1<63:0> represents that bit 63 to bit 0 of a data block in group 1 of code stream blocks are respectively used as bit 128 to bit 65 of the target code block. When j=2, tx_coded<192:129>=TXD_2<63:0> represents that bit 63 to bit 0 of a data block in group 2 of code stream blocks are respectively used as bit 192 to bit 129 of the target code block. When j=3, tx_coded<256:193>=TXD_3<63:0> represents that bit 63 to bit 0 of a data block in group 3 of code stream blocks are respectively used as bit 256 to bit 193 of the target code block.

For example, FIG. 3 is a schematic diagram of a process of obtaining a target code block. As shown in FIG. 3, for obtained four groups of code stream blocks, in each group of code stream blocks, each control block is represented as TXC<7:0>, and each data block is represented as TXD<63:0>. If TXC<7:0> in each of the four groups of code stream blocks is 0x00, a type of the target code block is a data code block. For example, the type of the target code block corresponds to bit 0 of the target code block, and bit 0 is set to 1, indicating that the type is the data code block. This embodiment of this application imposes no limitation on a manner in which bit 0 is set to a value to indicate that the type is the data code block. Based on a sequence of the four groups of code stream blocks, a plurality of bits of data blocks in the four groups of code stream blocks are separately used as a plurality of bits of a data unit, to obtain the data unit. Therefore, a target bit can be obtained based on the type and the data unit.

For example, a structure of the obtained target code block is shown in FIG. 4. Bit 0 of the target code block indicates a type of the target code block, and bit 0 is set to 1 to indicate that the type of the target code block is a data code block. Bit 1 to bit 256 of the target code block indicate a data unit of the target code block, where DO represents 64 bits of a data block in group 0 of code stream blocks, D1 represents 64 bits of a data block in group 1 of code stream blocks, D2 represents 64 bits of a data block in group 2 of code stream blocks, and D3 represents 64 bits of a data block in group 3 of code stream blocks.

In the encoding manner 2: a type of the target code block is determined as a control code block based on the control blocks in the $2^n$ groups of code stream blocks; identifier values of the $2^n$ groups of code stream blocks are obtained based on the control blocks in the $2^n$ groups of code stream blocks, where the identifier value indicates a type of the code stream block; the identifier values of the $2^n$ groups of code stream blocks are used as a type indication; the first encoding is performed on the data blocks in the $2^n$ groups of code stream blocks in a sequence determined based on the control blocks and the data blocks in the $2^n$ groups of code stream blocks, to obtain code block content; and the target code block is obtained based on the type and the data unit, where the data unit includes the type indication and the code block content.

For example, the target code block obtained in the encoding manner 2 includes the type and the data unit. The type indicates that the target code block is the control code block; and the data unit includes the type indication and the code block content, the code block content is obtained by performing the first encoding on the data blocks in the $2^n$ groups of code stream blocks in the sequence determined based on the control blocks and the data blocks in the $2^n$ groups of code stream blocks, the type indication is obtained based on the control blocks in the $2^n$ groups of code stream blocks, and the type indication indicates the type of each group of code stream blocks. For example, the sequence determined based on the control blocks and the data blocks in the $2^n$ groups of code stream blocks is a receiving sequence of the $2^n$ groups of code stream blocks.

In a possible implementation, if a control block in at least one group of the $2^n$ groups of code stream blocks is a second specified value, it can be determined by using the second specified value that the type of the target code block is the control code block. The second specified value indicates that a type of the code stream block is a control code stream block, and the second specified value is different from the first specified value. In other words, when the type of the at least one group of the $2^n$ groups of code stream blocks is the control code stream block, the type of the target code block is the control code block. For example, the control block in each group of code stream blocks is represented as TXC<7:0>, and the first specified value is 0x00. When TXC<7:0> of one group of the groups of code stream blocks is not 0x00, the target code block is the control code block.

For example, for one group of the $2^n$ groups of code stream blocks, when a type of the group of code stream blocks is a data code stream block, an identifier value of the group of code stream blocks is a third specified value; or when a type of the group of code stream blocks is a control code stream block, an identifier value of the group of code stream blocks is a fourth specified value. For example, the third specified value is 1, and the fourth specified value is 0. For example, that the identifier values of the $2^n$ groups of code stream blocks are used as a type indication includes: The identifier values of the $2^n$ groups of code stream blocks are respectively used as bits of the type indication in the sequence determined based on the control blocks and the data blocks in the $2^n$ groups of code stream blocks, to obtain the type indication.

For example, that the first encoding is performed on the data blocks in the $2^n$ groups of code stream blocks in a sequence determined based on the control blocks and the data blocks in the $2^n$ groups of code stream blocks, to obtain code block content includes: The first encoding is performed on the data blocks in the $2^n$ groups of code stream blocks in the sequence determined based on the control blocks and the data blocks in the $2^n$ groups of code stream blocks, to obtain first-encoded content of the groups of code stream blocks, and the first-encoded content of the groups of code stream blocks is used as the code block content.

In a possible implementation, for one group of code stream blocks, in the $2^n$ groups of code stream blocks, whose type is a data code stream block (TXC<7:0>=0x00), first-encoded content of the group of code stream blocks is content of a data block of the group of code stream blocks. For one group of code stream blocks, in the $2^n$ groups of code stream blocks, whose type is a control code stream block, based on cases of a control block and a data block of the group of code stream blocks, first-encoded content of the group of code stream blocks includes but is not limited to the following case A1 to case A11.

Case A1: The control block is 0x01, and bit 7 to bit 0 of the data block are 0xFB, where an LSB is a first sent bit.

For example, for the case A1, the data block includes one control byte and seven data bytes, where the data byte is also referred to as an octet. When the group of code stream blocks is the first group of control code stream blocks, first-encoded content of the group of code stream blocks is 60 bits, the first four bits are a type field (BTF) part, and the BTF part is 0x8. When the group of code stream blocks is not the first group of control code stream blocks, first-encoded content of the group of code stream blocks is 64 bits, the first eight bits are a BTF part, and the BTF part is 0x78. In either of the foregoing cases, the other 56 bits are bits of the seven data bytes included in the data block.

Case A2: The control block is 0xFF, and bit (k+7) to bit k of the data block are at least one of 0x06, 0x07, or 0xFE, where k=0, 1, 2, 3, 4, 5, 6, or 7, and an LSB is a first sent bit.

For example, for the case A2, the data block includes eight control bytes. When the group of code stream blocks is the first group of control code stream blocks, first-encoded content of the group of code stream blocks is 60 bits, the first four bits are a BTF part, and the BTF part is 0xE. When the group of code stream blocks is not the first group of control code stream blocks, first-encoded content of the group of code stream blocks is 64 bits, the first eight bits are a BTF part, and the BTF part is 0x1E. Regardless of the foregoing cases, the other 56 bits are bit 0 to bit 6 of the eight control bytes included in the data block.

Case A3: The control block is 0x01, and bit 7 to bit 0 of the data block are 0x9C, where an LSB is a first sent bit.

For example, for the case A3, the data block includes one control byte and seven data bytes. When the group of code stream blocks is the first group of control code stream blocks, first-encoded content of the group of code stream blocks is 60 bits, the first four bits are a BTF part, and the BTF part is 0xB. When the group of code stream blocks is not the first group of control code stream blocks, first-encoded content of the group of code stream blocks is 64 bits, the first eight bits are a BTF part, and the BTF part is 0x4B. Regardless of the foregoing cases, 24 bits after the BTF part are bit 31 to bit 8 of the data block. Four bits after the data byte are an O code. The O code can be obtained according to the IEEE 802.3 standard. For example, the other 28 bits are a plurality of first padding bits, and the plurality of first padding bits may be obtained based on the data bytes of the data block, or all the plurality of first padding bits are 0s.

Case A4: The control block is 0xFF, and bit 7 to bit 0 of the data block are 0xFD, where an LSB is a first sent bit.

For example, for the case A4, the data block includes eight control bytes. When the group of code stream blocks is the first group of control code stream blocks, first-encoded content of the group of code stream blocks is 60 bits, the first four bits are a BTF part, and the BTF part is 0x7. When the group of code stream blocks is not the first group of control code stream blocks, first-encoded content of the group of code stream blocks is 64 bits, the first eight bits are a BTF part, and the BTF part is 0x87. Regardless of the foregoing cases, seven bits after the BTF part are all 0s, and the other 49 bits are bit 6 to bit 0 of the last seven control bytes included in the data block.

Case A5: The control block is 0xFE, and bit 15 to bit 8 of the data block are 0xFD, where an LSB is a first sent bit.

For example, for the case A5, the data block includes one data byte and seven control bytes. When the group of code stream blocks is the first group of control code stream blocks, first-encoded content of the group of code stream blocks is 60 bits, the first four bits are a BTF part, and the BTF part is 0x9. When the group of code stream blocks is not the first group of control code stream blocks, first-encoded content of the group of code stream blocks is 64 bits, the first eight bits are a BTF part, and the BTF part is 0x99. Regardless of the foregoing cases, eight bits after the BTF part are bits of the data byte included in the data block, six bits after the data bytes are all 0s, and the other 42 bits are bit 6 to bit 0 of the last six control bytes included in the data block.

Case A6: The control block is 0xFC, and bit 23 to bit 16 of the data block are 0xFD, where an LSB is a first sent bit.

For example, for the case A6, the data block includes two data bytes and six control bytes. When the group of code stream blocks is the first group of control code stream blocks, first-encoded content of the group of code stream blocks is 60 bits, the first four bits are a BTF part, and the BTF part is 0xA. When the group of code stream blocks is not the first group of control code stream blocks, first-encoded content of the group of code stream blocks is 64 bits, the first eight bits are a BTF part, and the BTF part is 0xAA. Regardless of the foregoing cases, 16 bits after the BTF part are bits of the two data bytes included in the data block, five bits after the data bytes are all 0s, and the other 35 bits are bit 6 to bit 0 of the last five control bytes included in the data block.

Case A7: The control block is 0xF8, and bit 31 to bit 24 of the data block are 0xFD, where an LSB is a first sent bit.

For example, for the case A7, the data block includes three data bytes and five control bytes. When the group of code stream blocks is the first group of control code stream blocks, first-encoded content of the group of code stream blocks is 60 bits, the first four bits are a BTF part, and the BTF part is 0x4. When the group of code stream blocks is not the first group of control code stream blocks, first-encoded content of the group of code stream blocks is 64 bits, the first eight bits are a BTF part, and the BTF part is 0xB4. Regardless of the foregoing cases, 28 bits after the BTF part are bits of the three data bytes included in the data block, four bits after the data bytes are all 0s, and the other 28 bits are bit 6 to bit 0 of the last four control bytes included in the data block.

Case A8: The control block is 0xF0, and bit 39 to bit 32 of the data block are 0xFD, where an LSB is a first sent bit.

For example, for the case A8, the data block includes four data bytes and four control bytes. When the group of code stream blocks is the first group of control code stream blocks, first-encoded content of the group of code stream blocks is 60 bits, the first four bits are a BTF part, and the BTF part is 0xC. When the group of code stream blocks is not the first group of control code stream blocks, first-encoded content of the group of code stream blocks is 64 bits, the first eight bits are a BTF part, and the BTF part is 0xCC. Regardless of the foregoing cases, 32 bits after the BTF part are bits of the four data bytes included in the data block, three bits after the data bytes are all 0s, and the other 21 bits are bit 6 to bit 0 of the last three control bytes included in the data block.

Case A9: The control block is 0xE0, and bit 47 to bit 40 of the data block are 0xFD, where an LSB is a first sent bit.

For example, for the case A9, the data block includes five data bytes and three control bytes. When the group of code stream blocks is the first group of control code stream blocks, first-encoded content of the group of code stream blocks is 60 bits, the first four bits are a BTF part, and the BTF part is 0x2. When the group of code stream blocks is not the first group of control code stream blocks, first-encoded content of the group of code stream blocks is 64 bits, the first eight bits are a BTF part, and the BTF part is 0xD2. Regardless of the foregoing cases, 32 bits after the BTF part are bits of the five data bytes included in the data block, two bits after the data bytes are all 0s, and the other 12 bits are bit 6 to bit 0 of the last two control bytes included in the data block.

Case A10: The control block is 0xC0, and bit 55 to bit 48 of the data block are 0xFD, where an LSB is a first sent bit.

For example, for the case A10, the data block includes six data bytes and two control bytes. When the group of code stream blocks is the first group of control code stream blocks, first-encoded content of the group of code stream blocks is 60 bits, the first four bits are a BTF part, and the BTF part is 0x1. When the group of code stream blocks is not the first group of control code stream blocks, first-encoded content of the group of code stream blocks is 64 bits, the first eight bits are a BTF part, and the BTF part is 0xE1. Regardless of the foregoing cases, 48 bits after the BTF part are bits of the six data bytes included in the data block, one bit after the data bytes is 0, and the other seven bits are bit 6 to bit 0 of the last control byte included in the data block.

Case A11: The control block is 0x80, and bit 63 to bit 56 of the data block are 0xFD, where an LSB is a first sent bit.

For example, for the case A11, the data block includes seven data bytes and one control byte. When the group of code stream blocks is the first group of control code stream blocks, first-encoded content of the group of code stream blocks is 60 bits, the first four bits are a BTF part, and the BTF part is 0xF. When the group of code stream blocks is not the first group of control code stream blocks, first-encoded content of the group of code stream blocks is 64 bits, the first eight bits are a BTF part, and the BTF part is 0xFF. Regardless of the foregoing cases, the other 56 bits are bits of the seven data bytes included in the data block.

Therefore, in the sequence determined based on the control blocks and the data blocks in the $2^n$ groups of code stream blocks, the first-encoded content of the $2^n$ groups of code stream blocks is used as the code block content. Therefore, the target code block can be obtained based on the type, the type indication, and code block content.

For example, j represents a sequence number of one group of four groups of code stream blocks, where j=0, 1, 2, or 3. TXC_j<7:0> represents a control block of group j of code stream blocks, tx_payload<251:0> represents first-encoded content of the four groups of code stream blocks, tx_coded<256:0> represents a target code block, tx_coded<0> represents a type of the target code block, tx_coded<j+1> represents a type indication of the target code block, and tx_coded<256:5> represents code block content of the target code block. In this case, bits of tx_coded<256:0> are denoted in the following expression 3 to expression 5:

$$\text{tx\_coded} < 0 >= 0 \quad \text{(Expression 3)}$$

$$\text{tx\_coded} < j+1 >= \begin{cases} 0, & \text{TXC\_j} < 7:0 > \ != 0x00 \\ 1, & \text{TXC\_j} < 7:0 >= 0x00 \end{cases} \quad j = 0, 1, 2, \text{ or } 3 \quad \text{(Expression 4)}$$

$$\text{tx\_coded} < 256:5 >= \text{tx\_payload} < 251:0 > \quad \text{(Expression 5)}$$

In the expression 3, tx_coded<0>=0 indicates that the type is a control block. In the expression 4, when TXC_j<7:0> is not 0x00, a bit of the target code block corresponding to the value of j is 0; or when TXC_j<7:0> is 0x00, a bit of the target code block corresponding to the value of j is 1. In the expression 5, tx_coded<256:5>=tx_payload<251:0> represents that a plurality of bits of first-encoded content of the four groups of code stream blocks are respectively used as a plurality of bits of the code block content.

For example, structures of target code blocks are shown in FIG. 5, and 0 to 3 in FIG. 5 respectively represent sequence numbers of four groups of code stream blocks. In FIG. 5, the left side represents types of the obtained four groups of code stream blocks, C represents a control code stream block, and D represents a data code stream block. The right side of FIG. 5 shows structures of target code blocks obtained in different cases, where b represents a bit. For example, 1b represents one bit, and 4b represents four bits. For example, the types of the four groups of code stream blocks corresponding to a case 1 in FIG. 5 are all control code stream blocks, bit 0 of the target code block obtained through first encoding is 0, and bit 4 to bit 1 are all 0s; bit 8 to bit 5 are represented as f_0, and correspond to a BTF part in first-encoded content of group 0 of code stream blocks, and bit 64 to bit 9 correspond to other content in the first-encoded content of group 0 of code stream blocks, that is, C0; bit 72 to bit 65 are represented as BTF1, and correspond to a BTF part in first-encoded content of group 1 of code stream blocks, and bit 128 to bit 73 correspond to other content in the first-encoded content of group 1 of code stream blocks, that is, C1; bit 136 to bit 129 are represented as BTF2, and correspond to a BTF part in first-encoded content of group 2 of code stream blocks, and bit 192 to bit 137 correspond to other content in the first-encoded content of group 2 of code stream blocks, that is, C2; and bit 200 to bit 193 are represented as BTF3, and correspond to a BTF part in first-encoded content of group 3 of code stream blocks, and bit 256 to bit 201 correspond to other content in first-encoded content of group 4 of code stream blocks, that is, C3. A principle of other cases in FIG. 5 is the same as that of the foregoing case 1. For example, in a case 2, bit 68 to bit 5 of the target code block are represented as DO, and correspond to first-encoded content of group 0 of code stream blocks, bit 72 to bit 69 are represented as f_1, and correspond to a BTF part in first-encoded content of group 1 of code stream blocks, and bit 128 to bit 73 correspond to other content in the first-encoded content of group 1 of code stream blocks, that is, C1. The other cases in FIG. 5 are not described herein again.

In a possible implementation, the target code block is an error code block, and the error code block includes error indication data. For example, when one group of the $2^n$ groups of code stream blocks does not belong to a data code stream block, and does not belong to any one of the foregoing cases A1 to A11, it is determined that the target code block is an error code block; and types of the $2^n$ groups of code stream blocks are obtained based on the control blocks in the $2^n$ groups of code stream blocks, and a type indication of a target code stream block is obtained based on the types of the $2^n$ groups of code stream blocks, where the type and the type indication are used as error indication data in the error code block. For example, bit 0 of the target code block corresponds to the type, and bit 1 to bit 4 correspond to the type indication, where bit 0 is set to 0, and bit 1 to bit 4 are all set to 1s.

For example, when the target code block is an error code block, a structure of the target code block is shown in FIG. 6. The left side of FIG. 6 represents types of obtained four groups of code stream blocks, and E represents an error code stream block. The right side of FIG. 6 is a structure of a target code block. Bit 0 of the target code block is 0, bit 1 to bit 4 are all 1s, bit 5 to bit 64 correspond to padding content obtained based on group 1 of code stream blocks, bit 65 to bit 128 correspond to padding content obtained based on group 2 of code stream blocks, bit 129 to bit 192 correspond to padding content obtained based on group 3 of code stream blocks, and bit 193 to bit 256 correspond to padding content obtained based on group 4 of code stream blocks. For example, each bit of the padding content is 0. For example, the padding content obtained based on group 1 of code stream blocks is represented as E0, the padding content obtained based on group 2 of code stream blocks is represented as E1, the padding content obtained based on group 3 of code stream blocks is represented as E2, and the padding content obtained based on group 4 of code stream blocks is represented as E3.

According to the encoding method provided in this embodiment of this application, the first encoding can be performed on different types of code stream blocks to obtain the target code block. Therefore, the method is widely applied.

In a possible implementation, the performing first encoding on the $2^n$ groups of code stream blocks to obtain a target code block includes: obtaining an error detection result based on the control blocks and the data blocks in the $2^n$ groups of code stream blocks; and processing the $2^n$ groups of code stream blocks based on the error detection result, and performing the first encoding on processed $2^n$ groups of code stream blocks to obtain the target code block. In other words, the target code block is obtained by processing the $2^n$ groups of code stream blocks based on the error detection result, and the error detection result is obtained based on the control blocks and the data blocks in the $2^n$ groups of code stream blocks.

For example, the obtaining an error detection result based on the control blocks and the data blocks in the $2^n$ groups of code stream blocks includes: obtaining content and a content sequence of the $2^n$ groups of code stream blocks based on the control blocks and the data blocks in the $2^n$ groups of code stream blocks, and obtaining the error detection result based on the content and the content sequence of the $2^n$ groups of code stream blocks. For example, when the content sequence of the $2^n$ groups of code stream blocks is at least one case in a first error case set, an error occurs in the content sequence of the $2^n$ groups of code stream blocks. When the content sequence of the 2n groups of code stream blocks is not any case in the first error case set, the content sequence of the $2^n$ groups of code stream blocks is correct. For another example, when the content of the $2^n$ groups of code stream blocks is at least one case in a second error case set, an error occurs in the content of the $2^n$ groups of code stream blocks. When the content of the $2^n$ groups of code stream blocks is not any case in the second error case set, the content of the $2^n$ groups of code stream blocks is correct.

In a possible implementation, two adjacent groups of code stream blocks are used as an example for description, and the first error case set includes but is not limited to the following four cases:

(1) When the former group of code stream blocks includes a start control character (/S/), the latter group of code stream blocks includes other content than a data byte.

(2) When the former group of code stream blocks includes only a data byte, the latter group of code stream blocks includes other content than the data byte or a terminate control character (/T/).

(3) When the former group of code stream blocks includes a terminate control character, the latter group of code stream blocks includes other content than an idle control character (/I/) or a sequence ordered set control character (/O/).

(4) When the former group of code stream blocks includes an idle control character or a sequence ordered set control character, the latter group of code stream blocks includes a data byte or a terminate control character.

In a possible implementation, one group of code stream blocks is used as an example for description, and the second error case set includes but is not limited to the following four cases:

(1) For a code stream block including a start control character, the start control character is followed by other content than a data byte.

(2) For a code stream block including a data byte, the data byte is followed by other content than the data byte or a terminate control character.

(3) For a code stream block including a terminate control character, the terminate control character is followed by other content than an idle control character or a sequence ordered set control character.

(4) For a code stream block including an idle control character or a sequence ordered set control character, the idle control character or the sequence ordered set control character is followed by a data byte or a terminate control character.

For example, the error detection result includes a content sequence error or content error of the $2^n$ groups of code stream blocks, an error block is obtained based on a code stream block that has a content sequence error or content error in the $2^n$ groups of code stream blocks, and the first encoding is performed on a code stream block that has a correct content sequence and correct content and the error block in the $2^n$ groups of code stream blocks to obtain the target code block. In other words, when the error detection result includes the content sequence error or the content error of the $2^n$ groups of code stream blocks, the target code block is obtained by performing the first encoding based on the code stream block that has the correct content sequence and correct content and the error block in the $2^n$ groups of code stream blocks, and the error block is obtained based on the code stream block that has the content sequence error or content error in the $2^n$ groups of code stream blocks. For example, the error block includes an error control character.

In a possible implementation, for a code stream block that has a content sequence error or content error, content of the code stream block is converted into an error control character to obtain an error block. For example, a code stream block that has a content sequence error or content error is the first group of code stream blocks, and content of the code stream block is converted into a first error control character, where the first error control character is 60 bits, the first four bits are 0xE, and every seven bits thereafter are 0x1E. For another example, if a code stream block that has a content sequence error or content error is at least one of the second group of code stream blocks, the third group of code stream blocks, or the fourth group of code stream blocks, content of the code stream block is converted into a second error control character, where the second error control character is 64 bits, the first eight bits are 0x1E, and every seven bits thereafter are 0x1E.

For example, that the first encoding is performed on a code stream block that has a correct content sequence and correct content and the error block in the $2^n$ groups of code stream blocks to obtain the target code block includes: The type of the target code block is determined as a control code block; the identifier values of the $2^n$ groups of code stream blocks are obtained, where the identifier value indicates the type of the code stream block, and the identifier values of the $2^n$ groups of code stream blocks are used as the type indication; and the first encoding is performed, in the sequence determined based on the control blocks and the data blocks in the $2^n$ groups of code stream blocks, on the error block and a data block of the code stream block that has the correct content sequence and correct content in the $2^n$ groups of code stream blocks, to obtain the code block content.

For example, the first encoding is performed, in the sequence determined based on the control blocks and the data blocks in the $2^n$ groups of code stream blocks, the data block of the code stream block that has the correct content sequence and correct content in the $2^n$ groups of code stream blocks, to obtain first-encoded content of the code stream block that has the correct content sequence and correct content, and the target code block is obtained based on the first-encoded content of the code stream block that has the correct content sequence and correct content and the error block. For a manner of performing the first encoding on the data block of the code stream block that has the correct content sequence and correct content, refer to the foregoing related content of performing the first encoding on the code stream block whose type is the data code stream block and the code stream block whose type is the control code stream block. Details are not described herein again.

For example, when each group of the $2^n$ groups of code stream blocks is a code stream block that has a content sequence error or content error, the first encoding is performed on $2^n$ error blocks obtained based on the $2^n$ groups of code stream blocks to obtain a target code block, where the target code block is an error code block.

The code stream block in which the error occurs is processed, so that error data can be distinguished from correct data in subsequent data transmission, to ensure data reliability.

For example, after the target code block is obtained, the method further includes: performing second encoding on the target code block based on an FEC code type, to obtain first data; and sending the first data. A manner of performing the second encoding on the target code block based on the FEC code type is not limited in this embodiment of this application. The second encoding is performed on the target code block based on the FEC code type to obtain the first data, so that a receive end can perform error correction on the received first data, to ensure data transmission accuracy.

According to the encoding method provided in this embodiment of this application, the target code block is obtained by performing the first encoding on the $2^n$ groups of code stream blocks including the control blocks and the data blocks, without a need of performing 64B/66B encoding on each group of the $2^n$ groups of code stream blocks to obtain $2^n$ 66-bit code blocks and transcoding the $2^n$ 66-bit code blocks. Therefore, encoding efficiency is improved, and a delay, power consumption, and chip area occupation caused by the encoding process are reduced.

The foregoing describes the encoding method provided in embodiments of this application. The following describes a decoding method provided in embodiments of this application. With reference to the implementation scenario shown in FIG. 1, a decoding method provided in an embodiment of this application is shown in FIG. 7. For example, the decoding method provided in this embodiment of this application is performed by the chip 104 in FIG. 1, and the method includes but is not limited to operation 701 and operation 702.

Operation 701: Obtain a target code block, where the target code block includes a type and a data unit.

For example, with reference to the implementation scenario in FIG. 1, the chip 102 sends, to the chip 104 through the channel 105, first data encoded by using an FEC code type. In a data transmission process, an error bit may occur in the first data. The data in which the error bit occurs is referred to as second data, and the chip 104 receives the second data through the channel 105.

In a possible implementation, the obtaining a target code block includes but is not limited to the following manner A and manner B.

Manner A: The second data is received, where the second data is obtained based on the first data that is encoded by using the FEC code type; and second decoding is performed on the second data to obtain the target code block, where the second decoding is error correction processing.

For example, the target code block is an error code block obtained when error correction is performed on the second data but the error correction fails. For example, that second decoding is performed on the second data to obtain the target code block includes: The second data is processed based on the FEC code type to obtain a first codeword, error correction processing is performed on the first codeword, and the target code block is obtained based on a result of the error correction processing.

For example, the chip 104 has a function of an FEC decoder. When the FEC decoder determines that a quantity of error bits exceeds an error correction capability of the FEC decoder, in other words, when determining that error correction cannot be performed on the first codeword, the FEC decoder marks all code blocks in the first codeword as error code blocks. Therefore, when the result of the error correction processing is that all the code blocks in the first codeword are marked as the error code blocks, the obtained target code block is the error code block.

For example, when the result of the error correction processing is that the error correction on the first codeword succeeds, a code block obtained based on the corrected first codeword is used as the obtained target code block, and the code block obtained based on the corrected first codeword is a code block that is successfully corrected.

Manner B: The second data is received, where the second data is obtained based on the first data that is encoded by using the forward error correction FEC code type; and second decoding is performed on the second data to obtain the target code block, where the second decoding is error detection processing with error correction bypassed.

For example, the target code block is an error code block obtained through the error detection processing with error correction bypassed on the second data. For example, that second decoding is performed on the second data to obtain the target code block includes: The second data is processed based on the FEC code type to obtain a first codeword, error detection processing with error correction bypassed (bypass correction) is performed on the first codeword; and the target code block is obtained based on a result of the error detection processing with error correction bypassed.

For example, the chip 104 has a function of an FEC decoder. When detecting that an error exists in the first codeword, the FEC decoder marks all code blocks in the first codeword as error code blocks. Therefore, when the result of the error detection processing with error correction bypassed is that all the code blocks in the first codeword are marked as the error code blocks, the obtained target code block is the error code block.

For example, when the result of the error detection processing with error correction bypassed is that the first codeword is error free, a code block obtained based on the first codeword is used as the obtained target code block, and the code block obtained based on the first codeword is an error-free code block.

For example, a frame check sequence (FCS) frame check performed based on the target code block fails. For example, the target code block is 257 bits, the first five bits are 01111, and the other 252 bits include but are not limited to the following three cases: (1) The first four bits are 0x1, and every eight bits in the other bits are 0x1E. (2) Every eight bits in the first 248 bits are 0x1E, and the last four bits are 0x1. (3) Each bit is 0.

Operation S702: Perform first decoding on the target code block based on the type and the data unit of the target code block, to obtain $2^n$ groups of code stream blocks, where any group of code stream blocks includes a control block and a data block that are obtained based on the type and the data unit, and n is an integer greater than 1.

For example, the target code block is 257 bits, and in each group of code stream blocks, the control block is eight bits and the data block is 64 bits. An example in which the first decoding is performed on one target code block to obtain four groups of code stream blocks (n=2) is used for description. When a plurality of target code blocks are obtained, the first decoding may be performed on each target code block, to obtain $2^n$ groups of code stream blocks. For example, when two target code blocks are obtained, the first decoding may be performed on each of the two code blocks to obtain four groups of code stream blocks, in other words, the first decoding is performed on the two target code blocks to obtain eight groups of code stream blocks.

In a possible implementation, the performing first decoding on the target code block based on the type and the data unit of the target code block, to obtain $2^n$ groups of code stream blocks includes but is not limited to the following decoding manner 1 to decoding manner 3.

In the decoding manner 1, the type of the target code block is determined as a data code block based on the type of the target code block, where the data unit of the target code block includes $2^n$ pieces of content each having a length of 8m, and m is a positive integer; and the control blocks in the $2^n$ groups of code stream blocks are obtained based on the type of the target code block, and the first decoding is separately performed on the $2^n$ pieces of content, each having the length of 8m, included in the data unit, to obtain the data blocks in the $2^n$ groups of code stream blocks.

For example, when the type indicates that the target code block is the data code block, the first decoding is performed on the target code block in the decoding manner 1 to obtain the $2^n$ groups of code stream blocks. A data block included in group i of code stream blocks in the $2^n$ groups of code stream blocks is obtained by performing the first decoding on content, in the data unit, that corresponds to group i of code stream blocks and that has a length of 8m, where i is an integer greater than or equal to 1 and less than or equal to $2^n$, or i is an integer greater than or equal to 0 and less than or equal to $2^n-1$.

In a possible implementation, the type of the target code block is 1, indicating that the target code block is the data code block, the data unit of the target code block includes four pieces of content each having a length of 8m, and one piece of content having the length of 8m corresponds to one group of code stream blocks. For example, the length of 8m is 64 bits. Control blocks in the four groups of code stream blocks are all set to 0x00, and the four pieces of 64-bit content are respectively used as content of data blocks in the four groups of code stream blocks.

For example, j represents a sequence number of one group of the four groups of code stream blocks, where j=0, 1, 2, or 3. RXC_j<7:0> represents a control block in group j of code stream blocks, RXD_j<63:0> represents a data block in group j of code stream blocks, rx_coded<256:0> represents the target code block, rx_coded<0> represents the type of the target code block, rx_coded<(64j+64):(64j+1)> represents bit (64j+64) to bit (64j+1) of the target code block, and content of RXC_j<7:0> and RXD_j<63:0> is denoted in the following expression 6 and expression 7:

$$\text{RXC\_j} < 7:0 >= 0x00,\ \text{where } j = 0, 1, 2, \text{ or } 3 \quad \text{(Expression 6)}$$

$$\text{RXD\_j} < 63:0 >= \text{rx\_coded} < (64j+64):(64j+1) >,\ \text{where } j = 0, 1, 2, \text{ or } 3 \quad \text{(Expression 7)}$$

In the expression 6, RXC_j<7:0>=0x00 indicates that the control block in each group of code stream blocks is 0x00. In the expression 7, RXD_j<63:0>=rx_coded<(64j+64):(64j+1)> indicates that every 64 bits of the data unit are used as 64 bits of the data block in one group of code stream blocks.

For example, when j=0, RXD_0<63:0>=rx_coded<64:1> indicates that bit 64 to bit 1 of the target code block are respectively used as bit 63 to bit 0 of the data block in group 0 of code stream blocks. When j=1, RXD_1<63:0>=rx_coded<128:65> indicates that bit 128 to bit 65 of the target code block are respectively used as bit 63 to bit 0 of the data block in group 1 of code stream blocks. When j=2, RXD_2<63:0>=rx_coded<192:129> indicates that bit 192 to bit 129 of the target code block are respectively used as bit 63 to bit 0 of the data block in group 2 of code stream blocks. When j=3, RXD_3<63:0>=rx_coded<256:193> indicates that bit 256 to bit 193 of the target code block are respectively used as bit 63 to bit 0 of the data block in group 3 of code stream blocks.

Decoding manner 2: The type of the target code block is determined as a control code block based on the type of the target code block, where the data unit of the target code block includes a type indication and code block content, the type indication includes $2^n$ bits, one bit in the $2^n$ bits indicates a type of one group of code stream blocks that corresponds to the bit and that is in the $2^n$ groups of code stream blocks, and the code block content includes $2^n$ bit groups; the control blocks in the $2^n$ groups of code stream blocks are obtained based on the type, the bits that correspond to the $2^n$ groups of code stream blocks and that are in the type indication, and the bit groups that correspond to the $2^n$ groups of code stream blocks and that are in the code block content; and the first decoding is performed on the bits that correspond to the $2^n$ groups of code stream blocks and that are in the type indication, and the bit groups that correspond to the $2^n$ groups of code stream blocks and that are in the code block content, to obtain the data blocks in the $2^n$ groups of code stream blocks.

For example, when the type indicates that the target code block is the control code block, the first decoding is performed on the target code block in the decoding manner 2 to obtain the $2^n$ groups of code stream blocks. A control block included in group i of code stream blocks in the $2^n$ groups of code stream blocks is obtained based on the type, a bit that corresponds to group i of code stream blocks and that is in the type indication, and a bit group that corresponds to group i of code stream blocks and that is the in code block content, where i is an integer greater than or equal to 1 and less than or equal to $2^n$, or i is an integer greater than or equal to 0 and less than or equal to $2^n-1$; and a data block included in group i of code stream blocks in the $2^n$ groups of code stream blocks is obtained by performing, based on the bit that corresponds to group i of code stream blocks and that is in the type indication, first decoding on the bit group that corresponds to group i of code stream blocks and that is in the code block content. For example, the bit group is a set of a plurality of bits.

For example, when one bit in the type indication is 1, a type of a code stream block obtained based on the bit is a data code stream block; or when one bit in the type indication is 0, a type of a code stream block obtained based on the bit is a control code stream block.

In a possible implementation, the $2^n$ bit groups include a first bit group and $2^n-1$ second bit groups, and a quantity of bits included in the first bit group is different from a quantity of bits included in the second bit group. For example, one bit of the type indication corresponds to one bit group of the code block content. For example, the structure of the target code block shown in FIG. 5 is used as an example for description. For a case 1, the type indication includes four bits, and the code block content includes four bit groups. The first bit of the type indication corresponds to a first bit group, and the first bit group is bit 5 to bit 64 of the target code block; the second bit of the type indication corresponds to one second bit group, and the second bit group corresponds to the second bit is bit 65 to bit 128 of the target code block; the third bit of the type indication corresponds to one second bit group, and the second bit group corresponding to the third bit is bit 129 to bit 192 of the target code block; and the fourth bit of the type indication corresponds to one second bit group, and the second bit group corresponding to the fourth bit is bit 193 to bit 256 of the target code block. For a case 2, the type indication includes four bits, and the code block content includes four bit groups. The first bit of the type indication corresponds to one second bit group, and the second bit group corresponding to the first bit is bit 5 to bit 67 of the target code block; the second bit of the type indication corresponds to a first bit group, and the first bit group is bit 68 to bit 128 of the target code block; the third bit of the type indication corresponds to one second bit group, and the second bit group corresponding to the third bit is bit 129 to bit 192 of the target code block; and the fourth bit of the type indication corresponds to one second bit group, and the second bit group corresponding to the fourth bit is bit 193 to bit 256 of the target code block. Principles of other cases are the same as those of the foregoing case 1 and case 2. Details are not described herein again.

In a possible implementation, for one bit of the type indication, when the bit is 1, a control block of a code stream block obtained based on the type, the bit, and a bit group corresponding to the bit is 0x00, and content of a data block of the code stream block obtained by performing, based on the bit, the first decoding on the bit group corresponding to the bit is content of the bit group. When the bit is 0, based on a position of the bit and a status of the bit group corresponding to the bit, the control block and the data block of the obtained code stream block include but are not limited to the following cases B1 to B11.

Case B1: The bit is the first bit whose value is 0, the first four bits of the bit group corresponding to the bit are a BTF part, and the BTF part is 0x8; or the bit is not the first bit whose value is 0, the first eight bits of the bit group corresponding to the bit are a BTF part, and the BTF part is 0x78.

For example, for the case B1, seven data bytes are included after the BTF part in the bit group corresponding to the bit. The control block of the code stream block is 0x01, and the data block of the code stream block is 64 bits. Bit 7 to bit 0 of the data block are 0xFB, and the other 56 bits are bits of the seven data bytes of the bit group corresponding to the bit. An LSB is a first sent bit.

Case B2: The bit is the first bit whose value is 0, the first four bits of the bit group corresponding to the bit are a BTF part, and the BTF part is 0xE; or the bit is not the first bit whose value is 0, the first eight bits of the bit group corresponding to the bit are a BTF part, and the BTF part is 0x1E.

For example, for the case B2, eight control bit groups are included after the BTF part in the bit group corresponding to the bit, and each control bit group includes seven bits. The control block of the code stream block is 0xFF, and the data block of the code stream block is 64 bits. The 64 bits of the data block are obtained based on the eight control bit groups, and every eight bits of the data block are based on one control bit group. A manner of obtaining each bit of the data block based on each control bit group is not limited in this embodiment of this application. For example, each bit of the data block is obtained based on each control bit group according to the IEEE 802.3 standard. For example, bit k+7 to bit k of the data block are at least one of 0x06, 0x07, or 0xFE, where k=0, 1, 2, 3, 4, 5, 6, or 7. An LSB is a first sent bit.

Case B3: The bit is the first bit whose value is 0, the first four bits of the bit group corresponding to the bit are a BTF part, and the BTF part is 0xB; or the bit is not the first bit whose value is 0, the first eight bits of the bit group corresponding to the bit are a BTF part, and the BTF part is 0x4B.

For example, for the case B3, three data bytes, one 4-bit O code, and a plurality of first padding bits are included after the BTF part in the bit group corresponding to the bit. The control block of the code stream block is 0x01, and the data block of the code stream block is 64 bits. Bit 7 to bit 0 of the data block are 0x9C, bit 31 to bit 8 of the data block are bits of the three data bytes, and the other 32 bits are obtained based on the plurality of first padding bits. An LSB is a first sent bit. A manner of obtaining the other 32 bits based on the plurality of first padding bits is not limited in this embodiment of this application.

Case B4: The bit is the first bit whose value is 0, the first four bits of the bit group corresponding to the bit are a BTF part, and the BTF part is 0x7; or the bit is not the first bit whose value is 0, the first eight bits of the bit group corresponding to the bit are a BTF part, and the BTF part is 0x87.

For example, for the case B4, one 7-bit terminate control character and seven control bit groups are included after the BTF part in the bit group corresponding to the bit, and each control bit group includes seven bits. The control block of the code stream block is 0xFF, and the data block of the code stream block is 64 bits. Bit 7 to bit 0 of the data block are 0xFD, and the other 56 bits are obtained based on the seven control bit groups, where every eight bits in the other 56 bits are obtained based on one control bit group. An LSB is a first sent bit.

Case B5: The bit is the first bit whose value is 0, the first four bits of the bit group corresponding to the bit are a BTF part, and the BTF part is 0x9; or the bit is not the first bit whose value is 0, the first eight bits of the bit group corresponding to the bit are a BTF part, and the BTF part is 0x99.

For example, for the case B5, one data byte, one 6-bit terminate control character, and six control bit groups are included after the BTF part in the bit group corresponding to the bit, and each control bit group includes seven bits. The control block of the code stream block is 0xFE, and the data block of the code stream block is 64 bits. Bit 7 to bit 0 of the data block are bits of the data byte, bit 15 to bit 8 of the data block are 0xFD, the other 48 bits are obtained based on the six control bit groups, and every eight bits in the other 48 bits are obtained based on one control bit group. An LSB is a first sent bit.

Case B6: The bit is the first bit whose value is 0, the first four bits of the bit group corresponding to the bit are a BTF part, and the BTF part is 0xA; or the bit is not the first bit whose value is 0, the first eight bits of the bit group corresponding to the bit are a BTF part, and the BTF part is 0xAA.

For example, for the case B6, two data bytes, one 5-bit terminate control character, and five control bit groups are included after the BTF part in the bit group corresponding to the bit, and each control bit group includes seven bits. The control block of the code stream block is 0xFC, and the data block of the code stream block is 64 bits. Bit 15 to bit 0 of the data block are obtained based on bits of the two data bytes, bit 23 to bit 16 of the data block are 0xFD, the other 40 bits are obtained based on the five control bit groups, and every eight bits in the other 40 bits are obtained based on one control bit group. An LSB is a first sent bit.

Case B7: The bit is the first bit whose value is 0, the first four bits of the bit group corresponding to the bit are a BTF part, and the BTF part is 0x4; or the bit is not the first bit whose value is 0, the first eight bits of the bit group corresponding to the bit are a BTF part, and the BTF part is 0xB4.

For example, for the case B7, three data bytes, one 4-bit terminate control character, and four control bit groups are included after the BTF part in the bit group corresponding to the bit, and each control bit group includes seven bits. The control block of the code stream block is 0xF8, and the data block of the code stream block is 64 bits. Bit 23 to bit 0 of the data block are obtained based on bits of the three data bytes, bit 31 to bit 24 of the data block are 0xFD, the other 32 bits are obtained based on the four control bit groups, and every eight bits in the other 32 bits are obtained based on one control bit group. An LSB is a first sent bit.

Case B8: The bit is the first bit whose value is 0, the first four bits of the bit group corresponding to the bit are a BTF part, and the BTF part is 0xC; or the bit is not the first bit whose value is 0, the first eight bits of the bit group corresponding to the bit are a BTF part, and the BTF part is 0xCC.

For example, for the case B8, four data bytes, one 3-bit terminate control character, and three control bit groups are included after the BTF part in the bit group corresponding to the bit, and each control bit group includes seven bits. The control block of the code stream block is 0xF0, and the data block of the code stream block is 64 bits. Bit 31 to bit 0 of the data block are obtained based on bits of the four data bytes, bit 39 to bit 32 of the data block are 0xFD, the other 24 bits are obtained based on the three control bit groups, and every eight bits in the other 24 bits are obtained based on one control bit group. An LSB is a first sent bit.

Case B9: The bit is the first bit whose value is 0, the first four bits of the bit group corresponding to the bit are a BTF part, and the BTF part is 0x2; or the bit is not the first bit whose value is 0, the first eight bits of the bit group corresponding to the bit are a BTF part, and the BTF part is 0xD2.

For example, for the case B9, five data bytes, one 2-bit terminate control character, and two control bit groups are included after the BTF part in the bit group corresponding to the bit, and each control bit group includes seven bits. The control block of the code stream block is 0xE0, and the data block of the code stream block is 64 bits. Bit 39 to bit 0 of the data block are obtained based on bits of the five data bytes, bit 47 to bit 40 of the data block are 0xFD, the other 16 bits are obtained based on the two control bit groups, and every eight bits in the other 16 bits are based on one control bit group. An LSB is a first sent bit.

Case B10: The bit is the first bit whose value is 0, the first four bits of the bit group corresponding to the bit are a BTF part, and the BTF part is 0x1; or the bit is not the first bit whose value is 0, the first eight bits of the bit group corresponding to the bit are a BTF part, and the BTF part is 0xE1.

For example, for the case B10, six data bytes, one 1-bit terminate control character, and one 7-bit control bit group are included after the BTF part in the bit group corresponding to the bit. The control block of the code stream block is 0xC0, and the data block of the code stream block is 64 bits. Bit 47 to bit 0 of the data block are obtained based on bits of the six data bytes, bit 55 to bit 48 of the data block are 0xFD, and the other eight bits are obtained based on the control bit group. An LSB is a first sent bit.

Case B11: The bit is the first bit whose value is 0, the first four bits of the bit group corresponding to the bit are a BTF part, and the BTF part is 0xF; or the bit is not the first bit whose value is 0, the first eight bits of the bit group corresponding to the bit are a BTF part, and the BTF part is 0xFF.

For example, for the case B11, seven data bytes are included after the BTF part in the bit group corresponding to the bit. The control block of the code stream block is 0x80, and the data block of the code stream block is 64 bits. Bit 55 to bit 0 of the data block are obtained based on bits of the seven data bytes, and bit 63 to bit 56 of the data block are 0xFD. An LSB is a first sent bit.

In some embodiments, that the control blocks in the $2^n$ groups of code stream blocks are obtained based on the type, the bits that correspond to the $2^n$ groups of code stream blocks and that are in the type indication, and the bit groups that correspond to the $2^n$ groups of code stream blocks and that are in the code block content; and the first decoding is performed on the bits that correspond to the $2^n$ groups of code stream blocks and that are in the type indication, and the bit groups that correspond to the $2^n$ groups of code stream blocks and that are in the code block content, to obtain the data blocks in the $2^n$ groups of code stream blocks includes: $2^n$ 64-bit third bit groups are obtained based on the $2^n$ bit groups; the control blocks in the $2^n$ code stream blocks are obtained based on the type, the bits that correspond to the $2^n$ code stream blocks and that are in the type indication, and the $2^n$ third bit groups; and the first decoding is performed on the $2^n$ third bit groups based on the bits that correspond to the $2^n$ code stream blocks and that are in the type indication, to obtain the data blocks in the $2^n$ code stream blocks.

For example, for the first bit whose value is 0, a bit group corresponding to the bit includes a 4-bit BTF part, and an 8-bit BTF part is obtained based on the 4-bit BTF part, to obtain a third bit group. For example, the IEEE 802.3 standard is queried based on the 4-bit BTF part to obtain the 8-bit BTF part; or a correspondence table of the 4-bit BTF part and the 8-bit BTF part is queried based on the 4-bit BTF part to obtain the 8-bit BTF part.

When the query is successful, the IEEE 802.3 standard includes the 8-bit BTF part corresponding to the 4-bit BTF part, or the corresponding table includes the 8-bit BTF part corresponding to the 4-bit BTF part, the 8-bit BTF part is used as the obtained 8-bit BTF part. When the query fails, the IEEE 802.3 standard does not include the 8-bit BTF part corresponding to the 4-bit BTF part, or the corresponding table does not include the 8-bit BTF part corresponding to the 4-bit BTF part, the 4-bit BTF part is marked to obtain the 8-bit BTF part. A manner of marking the 4-bit BTF part is not limited in this embodiment of this application. For example, the 4-bit BTF part is used as bit 3 to bit 0, and bit 7 to bit 4 are all set to 0s. For example, when the query fails, a control block of a code stream block obtained based on the third bit group is 0xFF, and a data block is 0xFEFEFEFE.

In some other embodiments, for the first bit whose value is 0, obtaining a control block of a code stream block based on the type, the bit, and a bit group corresponding to the bit, and performing, based on the bit, the first decoding on the bit group corresponding to the bit to obtain a data block of the code stream block includes: 8-bit BTF part is queried based on a 4-bit BTF part included in the bit group corresponding to the bit; and when the query fails, the control block of the code stream block is set to 0xFF, and the data block of the code stream block is set to 0xFEFEFEFE. A principle of a manner of querying the 8-bit BTF part based on the 4-bit BTF part is the same as that of the query manner in the foregoing related content. Details are not described herein again.

Decoding manner 3: Based on the type and the data unit of the target code block, the type of the target code block is determined as an error code block; and the control blocks and the data blocks in the $2^n$ groups of code stream blocks are obtained, where the $2^n$ groups of code stream blocks are all error code stream blocks.

For example, the data unit includes a type indication, and the type and the type indication indicate that the target code block is the error code block; and the control block included in each group of the $2^n$ groups of code stream blocks is the first value, the data block included in each group of the $2^n$ groups of code stream blocks is the second value, and the first value and the second value indicate that the code stream block is the error code stream block. For example, the type of the target code block is 0, the type indication is 1111, and the target code block is the error code block. In this case, the control block included in each group of the $2^n$ groups of code stream blocks obtained through the first decoding is 0xFF, and the data block included in each group of the $2^n$ groups of code stream blocks is 0xFEFEFEFE.

According to the decoding method provided in this embodiment of this application, the first decoding can be performed on different types of target code blocks to obtain $2^n$ groups of code stream blocks. Therefore, the method is widely applied.

In a possible implementation, the performing first decoding on the target code block based on the type and the data unit of the target code block, to obtain $2^n$ groups of code stream blocks includes: obtaining an error detection result based on the type and the data unit of the target code block; and performing the first decoding on the target code block based on the error detection result, and the type and the data unit of the target code block, to obtain the $2^n$ groups of code stream blocks. In other words, the $2^n$ groups of code stream blocks are obtained by performing the first decoding on the target code block based on the error detection result and the type and the data unit of the target code block, and the error detection result is obtained based on the type and the data unit of the target code block.

For example, the obtaining an error detection result based on the type and the data unit of the target code block includes: obtaining content and a content sequence of the target code block based on the type and the data unit of the target code block, and obtaining the error detection result based on the content and the content sequence of the target code block. For example, when the content sequence of the target code block is at least one case in a third error case set, an error occurs in the content sequence of the target code block; or when the content sequence of the target code block is not any case in the third error case set, the content sequence of the target code block is correct. For another example, when the content of the target code block is at least one case in a fourth error case set, an error occurs in the content of the target code block; or when the content of the target code block is not any case in the fourth error case set, the content of the target code block is correct.

In a possible implementation, an example in which the target code block is a control code block and the target code block includes four bit groups is used for description. For two adjacent bit groups, the fourth error case set includes but is not limited to the following four cases.

(1) When the former bit group includes a start control character (/S/), the latter bit group includes other content than a data byte.

(2) When the former bit group includes only a data byte, the latter bit group includes other content than the data byte or a terminate control character (/T/).

(3) When the former bit group includes a terminate control character, the latter bit group includes other content than an idle control character (/I/) or a sequence ordered set control character (/O/).

(4) When the former bit group includes an idle control character or a sequence ordered set control character, the latter bit group includes a data byte or a terminate control character.

For a meaning and a value of the control character in embodiments of this application, refer to IEEE 802.3-2018. Details are not described again in embodiments of this application.

In a possible implementation, one bit group is used as an example for description, and the fourth error case set includes but is not limited to the following four cases:

(1) For a bit group including a start control character, the start control character is followed by other content than a data byte.

(2) For a bit group including a data byte, the data byte is followed by other content than the data byte or a terminate control character.

(3) For a bit group including a terminate control character, the terminate control character is followed by other content than an idle control character or a sequence ordered set control character.

(4) For a bit group including an idle control character or a sequence ordered set control character, the idle control character or the sequence ordered set control character is followed by a data byte or a terminate control character.

In a possible implementation, the error detection result includes a content sequence error or content error of the target code block, and the performing the first decoding on the target code block based on the error detection result, and the type and the data unit of the target code block, to obtain the $2^n$ groups of code stream blocks includes: converting the target code block to obtain a second code block, and performing the first decoding on the second code block based on a type and a data unit of the second code block to obtain $2^n$ groups of code stream blocks. In other words, the $2^n$ groups of code stream blocks are obtained by performing the first decoding on the second code block based on the type and the data unit of the second code block, and the second code block is a code block that is obtained by converting the target code block and that has a same quantity of bits as the target code block.

For example, the converting the target code block to obtain a second code block includes: for a bit group that is in the target code block and that has a content sequence error or content error, converting the bit group that has the content sequence error or content error into an error control character; and obtaining the second code block based on the error control character and a bit group that is in the target code block and that has a correct content sequence and correct content. For example, a first bit group is converted into a first error control character, where the first bit group is a bit group that has a content sequence error or content error. For another example, a second bit group is converted into a second error control character, where the second bit group is a bit group that has a content sequence error or content error. In a possible implementation, the second code block obtained through the conversion is a control code block, and the first decoding may be performed on the second code block in the decoding manner 2.

In another possible implementation, the error detection result includes a content sequence error or content error of the target code block, and the performing the first decoding on the target code block based on the error detection result, and the type and the data unit of the target code block, to obtain the $2^n$ groups of code stream blocks includes: performing the first decoding on the target code block based on the type and the data unit of the target code block to obtain $2^n$ groups of first code stream blocks, and converting the $2^n$ groups of first code stream blocks to obtain $2^n$ groups of code stream blocks. In other words, the $2^n$ groups of code stream blocks are obtained by converting the $2^n$ groups of first code stream blocks, and the $2^n$ groups of first code stream blocks are obtained by performing the first decoding on the target code block based on the type and the data unit of the target code block.

For example, the converting the $2^n$ groups of first code stream blocks to obtain $2^n$ groups of code stream blocks includes: converting a code stream block into an error code stream block, where the code stream block is obtained based on a bit group that is in the $2^n$ groups of first code stream blocks and that has a content sequence error or content error. For example, in the error code stream block, a control block is 0xFF and a data block is 0xFEFEFEFE. The target code block in which the error occurs is processed, so that a receive end can distinguish between error data and correct data, to ensure data reliability.

According to the decoding method provided in this embodiment of this application, the $2^n$ groups of code stream blocks including the control blocks and the data blocks are obtained by performing the first decoding on the target code block, without a need of transcoding the target code block to obtain $2^n$ 66-bit code blocks and decoding the $2^n$ 66-bit code blocks. Therefore, decoding efficiency is improved, and a delay, power consumption, and chip area occupation caused by the decoding process are reduced.

Figure 8:
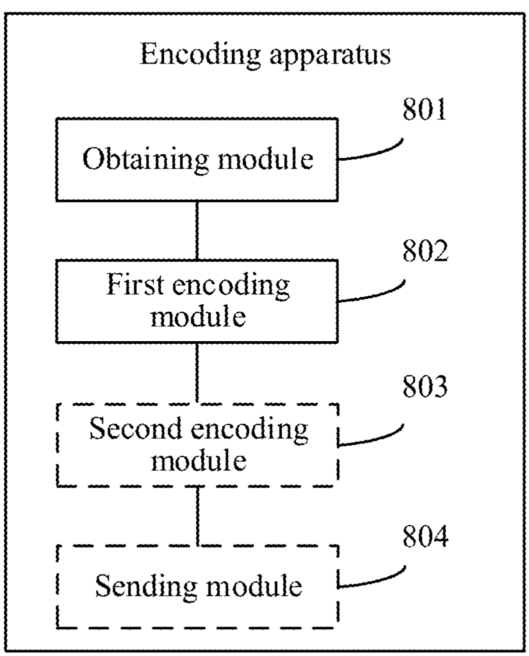
FIG. 8 is a schematic diagram of a structure of an encoding apparatus according to an embodiment of this application.

The foregoing describes the encoding method provided in embodiments of this application. Corresponding to the foregoing method, embodiments of this application further provide an encoding apparatus. FIG. 8 is a schematic diagram of a structure of an encoding apparatus according to an embodiment of this application. The apparatus is used in a first network device, and the first network device is the first network device in the embodiment shown in FIG. 1. Based on the following plurality of modules shown in FIG. 8, the encoding apparatus shown in FIG. 8 can perform all or some operations performed by the first network device. It should be understood that the apparatus may include more additional modules than the shown modules, or some of the shown modules are omitted. This is not limited in this embodiment of this application. As shown in FIG. 8, the apparatus includes:

an obtaining module 801, configured to obtain $2^n$ groups of code stream blocks, where any group of code stream blocks includes a control block and a data block, and n is an integer greater than 1; and a first encoding module 802, configured to perform first encoding on the $2^n$ groups of code stream blocks to obtain a target code block, where the target code block includes a type determined based on control blocks in the $2^n$ groups of code stream blocks and a data unit determined based on the control blocks and data blocks in the $2^n$ groups of code stream blocks.

In a possible implementation, the type indicates that the target code block is a data code block; and the data unit is obtained by performing the first encoding on the data blocks in the $2^n$ groups of code stream blocks in a sequence of the $2^n$ groups of code stream blocks.

In a possible implementation, the type indicates that the target code block is a control code block; and the data unit includes a type indication and code block content, the code block content is obtained by performing the first encoding on the data blocks in the $2^n$ groups of code stream blocks in a sequence determined based on the control blocks and the data blocks in the $2^n$ groups of code stream blocks, the type indication is obtained based on the control blocks in the $2^n$ groups of code stream blocks, and the type indication indicates a type of each group of code stream blocks.

In a possible implementation, the target code block is an error code block, and the error code block includes error indication data.

In a possible implementation, the target code block is obtained by processing the $2^n$ groups of code stream blocks based on an error detection result, and the error detection result is obtained based on the control blocks and the data blocks in the $2^n$ groups of code stream blocks.

In a possible implementation, the error detection result includes a content sequence error or content error of the $2^n$ groups of code stream blocks, the target code block is obtained by performing the first encoding based on a code stream block that has a correct content sequence and correct content and an error block in the $2^n$ groups of code stream blocks, and the error block is obtained based on a code stream block that has a content sequence error or content error in the $2^n$ groups of code stream blocks.

In a possible implementation, the control block includes m bits, the data block includes 8m bits, and m is a positive integer.

In a possible implementation, a value of n is 2, a value of m is 8, and the target code block is 257 bits.

In a possible implementation, all of the $2^n$ groups of code stream blocks are from a media independent interface MII.

In a possible implementation, the apparatus further includes: a second encoding module 803, configured to perform second encoding on the target code block based on a forward error correction FEC code type, to obtain first data; and a sending module 804, configured to send the first data.

According to the encoding apparatus provided in this embodiment of this application, the target code block is obtained by performing the first encoding on the $2^n$ groups of code stream blocks including the control blocks and the data blocks, without a need of performing 64B/66B encoding on each group of the $2^n$ groups of code stream blocks to obtain $2^n$ 66-bit code blocks and transcoding the $2^n$ 66-bit code blocks. Therefore, encoding efficiency is improved, and a delay, power consumption, and chip area occupation caused by the encoding process are reduced.

Figure 9:
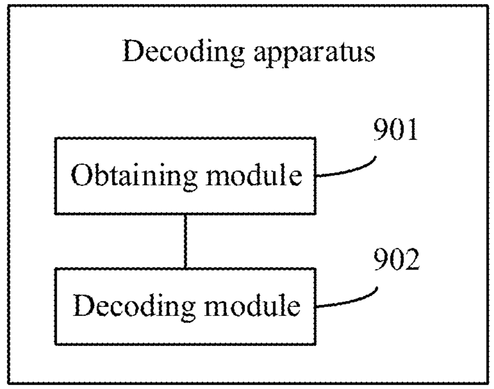
FIG. 9 is a schematic diagram of a structure of a decoding apparatus according to an embodiment of this application.

The foregoing describes the decoding method provided in embodiments of this application. Corresponding to the foregoing method, embodiments of this application further provide a decoding apparatus. FIG. 9 is a schematic diagram of a structure of a decoding apparatus according to an embodiment of this application. The apparatus may be used in a second network device, and the second network device is the second network device in the embodiment shown in FIG. 1. Based on the following plurality of modules shown in FIG. 9, the decoding apparatus shown in FIG. 9 can perform all or some operations performed by the second network device. It should be understood that the apparatus may include more additional modules than the shown modules, or some of the shown modules are omitted. This is not limited in this embodiment of this application. As shown in FIG. 9, the apparatus includes:

an obtaining module 901, configured to obtain a target code block, where the target code block includes a type and a data unit; and a decoding module 902, configured to perform first decoding on the target code block based on the type and the data unit of the target code block, to obtain $2^n$ groups of code stream blocks, where any group of code stream blocks includes a control block and a data block that are obtained based on the type and the data unit, and n is an integer greater than 1.

In a possible implementation, the type indicates that the target code block is a data code block; and a data block included in group i of code stream blocks in the $2^n$ groups of code stream blocks is obtained by performing the first decoding on content, in the data unit, that corresponds to group i of code stream blocks and that has a length of 8m, where m is a positive integer, and i is an integer greater than or equal to 1 and less than or equal to $2^n$, or i is an integer greater than or equal to 0 and less than or equal to $2^n-1$.

In a possible implementation, the type indicates that the target code block is a control code block, the data unit includes a type indication and code block content, the type indication includes $2^n$ bits, one bit in the $2^n$ bits indicates a type of one group of code stream blocks that corresponds to the bit and that is in the $2^n$ groups of code stream blocks, and the code block content includes $2^n$ bit groups; a control block included in group i of code stream blocks in the $2^n$ groups of code stream blocks is obtained based on the type, a bit that corresponds to group i of code stream blocks and that is in the type indication, and a bit group that corresponds to group i of code stream blocks and that is in the code block content, where i is an integer greater than or equal to 1 and less than or equal to $2^n$, or i is an integer greater than or equal to 0 and less than or equal to $2^n-1$; and the data block included in group i of code stream blocks in the $2^n$ groups of code stream blocks is obtained by performing, based on the bit that corresponds to group i of code stream blocks and that is in the type indication, the first decoding on the bit group that corresponds to group i of code stream blocks and that is in the code block content.

In a possible implementation, the $2^n$ bit groups include a first bit group and $2^n-1$ second bit groups, and a quantity of bits included in the first bit group is different from a quantity of bits included in the second bit group.

In a possible implementation, the data unit includes a type indication, and the type and the type indication indicate that the target code block is the error code block; and the control block included in each group of the $2^n$ groups of code stream blocks is the first value, the data block included in each group of the $2^n$ groups of code stream blocks is the second value, and the first value and the second value indicate that the code stream block is the error code stream block.

In a possible implementation, the obtaining module is configured to: receive second data, where the second data is obtained based on first data that is encoded by using a forward error correction FEC code type; and perform second decoding on the second data to obtain the target code block, where the second decoding is error correction processing.

In a possible implementation, the target code block is a code block obtained when error correction is performed on the second data but the error correction fails.

In a possible implementation, the obtaining module 901 is configured to: receive second data, where the second data is obtained based on first data that is encoded by using a forward error correction FEC code type; and perform second decoding on the second data to obtain the target code block, where the second decoding is error detection processing with error correction bypassed.

In a possible implementation, the target code block is a code block obtained when an error is detected from the second data but error correction is bypassed.

In a possible implementation, the $2^n$ groups of code stream blocks are obtained by performing the first decoding on the target code block based on an error detection result and the type and the data unit of the target code block, and the error detection result is obtained based on the type and the data unit of the target code block.

In a possible implementation, the error detection result includes a content sequence error or content error of the target code block, the $2^n$ groups of code stream blocks are obtained by performing the first decoding on a second code block based on a type and a data unit of the second code block, and the second code block is a code block that is obtained by converting the target code block and that has a same quantity of bits as the target code block.

In a possible implementation, the error detection result includes a content sequence error or content error of the target code block, the $2^n$ groups of code stream blocks are obtained by converting $2^n$ groups of first code stream blocks, and the $2^n$ groups of first code stream blocks are obtained by performing the first decoding on the target code block based on the type and the data unit of the target code block.

In a possible implementation, the control block includes m bits, the data block includes 8m bits, and m is a positive integer.

In a possible implementation, a value of n is 2, a value of m is 8, and the target code block is 257 bits.

In a possible implementation, all of the $2^n$ groups of code stream blocks are in a media independent interface MII format.

According to the decoding apparatus provided in this embodiment of this application, the $2^n$ groups of code stream blocks including the control blocks and the data blocks are obtained by performing the first decoding on the target code block, without a need of transcoding the target code block to obtain $2^n$ 66-bit code blocks and decoding the $2^n$ 66-bit code blocks. Therefore, decoding efficiency is improved, and a delay, power consumption, and chip area occupation caused by the decoding process are reduced.

It should be understood that, when the apparatuses provided in FIG. 8 and FIG. 9 implement functions of the apparatuses, division of the foregoing functional modules is merely used as an example for description. In actual application, the foregoing functions may be allocated to different functional modules for implementation based on a requirement, in other words, an internal structure of a device is divided into different functional modules, to implement all or some of the functions described above. In addition, the apparatuses provided in the foregoing embodiments and the method embodiments belong to a same concept. For implementation processes thereof, refer to the method embodiments. Details are not described herein again.

Figure 10:
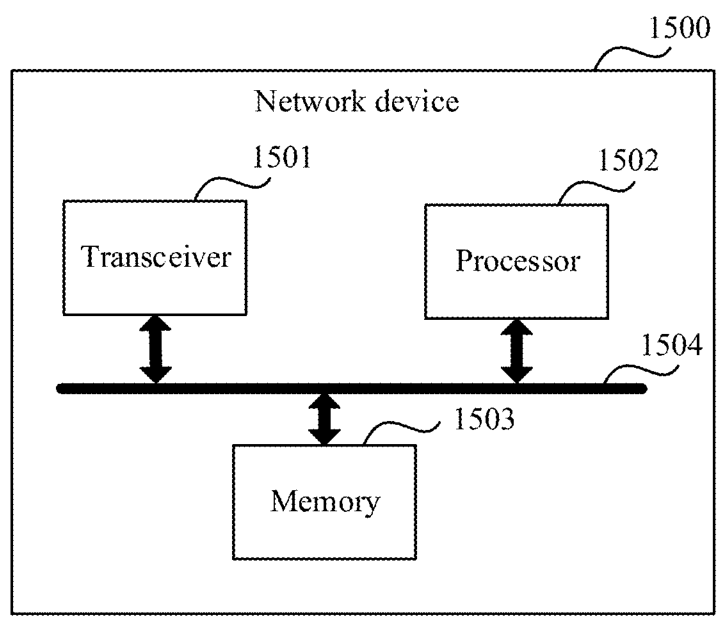
FIG. 10 is a schematic diagram of a structure of a network device according to an embodiment of this application.

For a hardware structure of the device in the foregoing embodiments, refer to a network device 1500 shown in FIG. 10. The network device 1500 includes a transceiver 1501, a processor 1502, and a memory 1503. The transceiver 1501, the processor 1502, and the memory 1503 are connected to each other by using a bus 1504. The transceiver 1501 is configured to receive a packet and send a packet. The memory 1503 is configured to store instructions or program code. The processor 1502 is configured to invoke the instructions or the program code in the memory 1503, to enable the device to perform related processing operations of the first network device or the second network device in the foregoing method embodiments. In one embodiment, the network device 1500 in this embodiment of this application may correspond to the first network device or the second network device in each of the foregoing method embodiments. The processor 1502 in the network device 1500 reads the instructions or program code in the memory 1503, to enable the network device 1500 shown in FIG. 10 to perform all or some of operations performed by the first network device or the second network device.

The network device 1500 may further correspond to the apparatuses shown in FIG. 8 and FIG. 9. For example, the obtaining module 801 and the obtaining module 901 in FIG. 8 and FIG. 9 are equivalent to the transceiver 1501, and the first encoding module 802 and the decoding module 902 are equivalent to the processor 1502.

Figure 11:
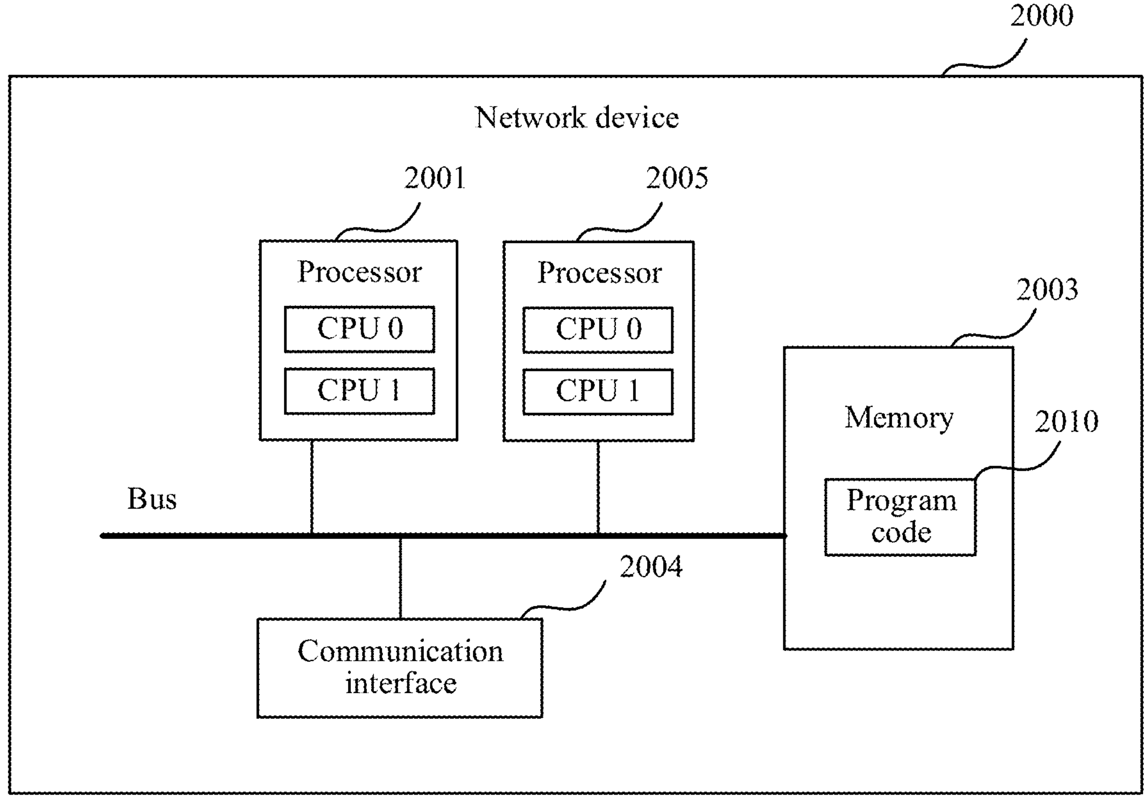
FIG. 11 is a schematic diagram of a structure of another network device according to an embodiment of this application.

FIG. 11 is a schematic diagram of a structure of a network device 2000 provided in an example embodiment of this application. The network device 2000 shown in FIG. 11 is configured to perform operations related to the encoding method shown in FIG. 2 and operations related to the decoding method shown in FIG. 7. The network device 2000 is, for example, a switch or a router.

As shown in FIG. 11, the network device 2000 includes at least one processor 2001, a memory 2003, and at least one communication interface 2004.

The processor 2001 is, for example, a general-purpose central processing unit (CPU), a digital signal processor (DSP), a network processor (NP), a graphics processing unit (GPU), a neural-network processing unit (NPU), a data processing unit (DPU), a microprocessor, or one or more integrated circuits configured to implement the solutions of this application. For example, the processor 2001 includes an application-specific integrated circuit (ASIC), a programmable logic device (PLD), or another programmable logic device, a transistor logic device, a hardware component, or any combination thereof. The PLD is, for example, a complex programmable logic device (CPLD), a field programmable gate array (FPGA), a generic array logic (GAL), or any combination thereof. The processor may implement or execute various logical blocks, modules, and circuits described with reference to the content disclosed in embodiments of the present disclosure. Alternatively, the processor may be a combination of processors implementing a computing function, for example, a combination of one or more microprocessors, or a combination of a DSP and a microprocessor.

In one embodiment, the network device 2000 further includes a bus. The bus is configured to transmit information between components of the network device 2000. The bus may be a peripheral component interconnect (PCI) bus, an extended industry standard architecture (EISA) bus, or the like. Buses may be classified into an address bus, a data bus, a control bus, and the like. For ease of representation, only one bold line is used to represent the bus in FIG. 11, but this does not mean that there is only one bus or only one type of bus. In addition to being connected through the bus, the components of the network device 2000 in FIG. 11 may be connected in another manner. A manner in which the components are connected is not limited in this embodiment of the present disclosure.

The memory 2003 is, for example, a read-only memory (ROM) or another type of static storage device that can store static information and instructions, for another example, a random access memory (RAM) or another type of dynamic storage device that can store information and instructions, for another example, an electrically erasable programmable read-only memory (EEPROM), a compact disc read-only memory (CD-ROM) or other optical disk storage, an optical disk storage (including compact disc, laser disc, optical disc, digital versatile disc, Blu-ray disc, and the like), a magnetic disk storage medium or another magnetic storage device, or any other medium that can be used to carry or store desired program code in a form of an instruction or a data structure and that can be accessed by a computer, but is not limited thereto. For example, the memory 2003 exists independently, and is connected to the processor 2001 through the bus. Alternatively, the memory 2003 and the processor 2001 may be integrated together.

The communication interface 2004 uses any apparatus such as a transceiver, and is configured to communicate with another device or a communication network. The communication network may be an ethernet, a radio access network (RAN), a wireless local area network (WLAN), or the like. The communication interface 2004 may include a wired communication interface, and may further include a wireless communication interface. In one embodiment, the communication interface 2004 may be an ethernet interface, a fast ethernet (FE) interface, a gigabit ethernet (GE) interface, an asynchronous transfer mode (ATM) interface, a wireless local area network (WLAN) interface, a cellular network communication interface, or a combination thereof. The ethernet interface may be an optical interface, an electrical interface, or a combination thereof. In this embodiment of this application, the communication interface 2004 may be used by the network device 2000 to communicate with another device.

During implementation, in an embodiment, the processor 2001 may include one or more CPUs, for example, a CPU 0 and a CPU 1 shown in FIG. 11. Each of the processors may be a single-core (single-CPU) processor, or may be a multi-core (multi-CPU) processor. The processor herein may be one or more devices, circuits, and/or processing cores configured to process data (for example, computer program instructions).

During implementation, in an embodiment, the network device 2000 may include a plurality of processors, such as the processor 2001 and a processor 2005 in FIG. 11. Each of the processors may be a single-core (single-CPU) processor or may be a multi-core (multi-CPU) processor. The processor herein may be one or more devices, circuits, and/or processing cores configured to process data (for example, computer program instructions).

During implementation, in an embodiment, the network device 2000 may further include an output device and an input device. The output device communicates with the processor 2001, and may display information in a plurality of manners. For example, the output device may be a liquid crystal display (LCD), a light emitting diode (LED) display device, a cathode ray tube (CRT) display device, a projector, or the like. The input device communicates with the processor 2001, and may receive an input from a user in a plurality of manners. For example, the input device may be a mouse, a keyboard, a touchscreen device, or a sensing device.

In some embodiments, the memory 2003 is configured to store program code 2010 for executing the solutions of this application, and the processor 2001 may execute the program code 2010 stored in the memory 2003. In other words, the network device 2000 may implement the encoding method or the decoding method provided in the method embodiments by using the processor 2001 and the program code 2010 in the memory 2003. The program code 2010 may include one or more software modules. In one embodiment, the processor 2001 may also store program code or instructions for executing the solutions of this application.

In one embodiment, the network device 2000 in this embodiment of this application may correspond to the first network device or the second network device in each of the foregoing method embodiments. The processor 2001 in the network device 2000 reads the program code 2010 in the memory 2003 or the program code or instructions stored in the processor 2001, to enable the network device 2000 shown in FIG. 11 to perform all or some of operations performed by the first network device or the second network device.

The network device 2000 may further correspond to the apparatuses shown in FIG. 8 and FIG. 9. Each function module in the apparatuses shown in FIG. 8 and FIG. 9 is implemented by using software of the network device 2000. In other words, the functional modules included in the apparatuses shown in FIG. 8 and FIG. 9 are generated after the processor 2001 in the network device 2000 reads the program code 2010 stored in the memory 2003. For example, the obtaining module 801 and the obtaining module 901 in FIG. 8 and FIG. 9 are equivalent to the communication interface 2004, and the first encoding module 802 and the decoding module 902 are equivalent to the processor 2001 and/or the processor 2005.

The operations of the method shown in FIG. 2 and FIG. 7 are completed by using an integrated logic circuit of hardware in the processor of the network device 2000 or instructions in a form of software. The operations of the method disclosed with reference to embodiments of this application may be directly performed by a hardware processor, or may be performed by a combination of hardware in the processor and a software module. A software module may be located in a mature storage medium in the art, such as a random access memory, a flash memory, a read-only memory, a programmable read-only memory, an electrically erasable programmable memory, or a register. The storage medium is located in the memory. The processor reads information in the memory, and completes the operations of the foregoing methods in combination with hardware of the processor. To avoid repetition, details are not described herein again.

Figure 12:
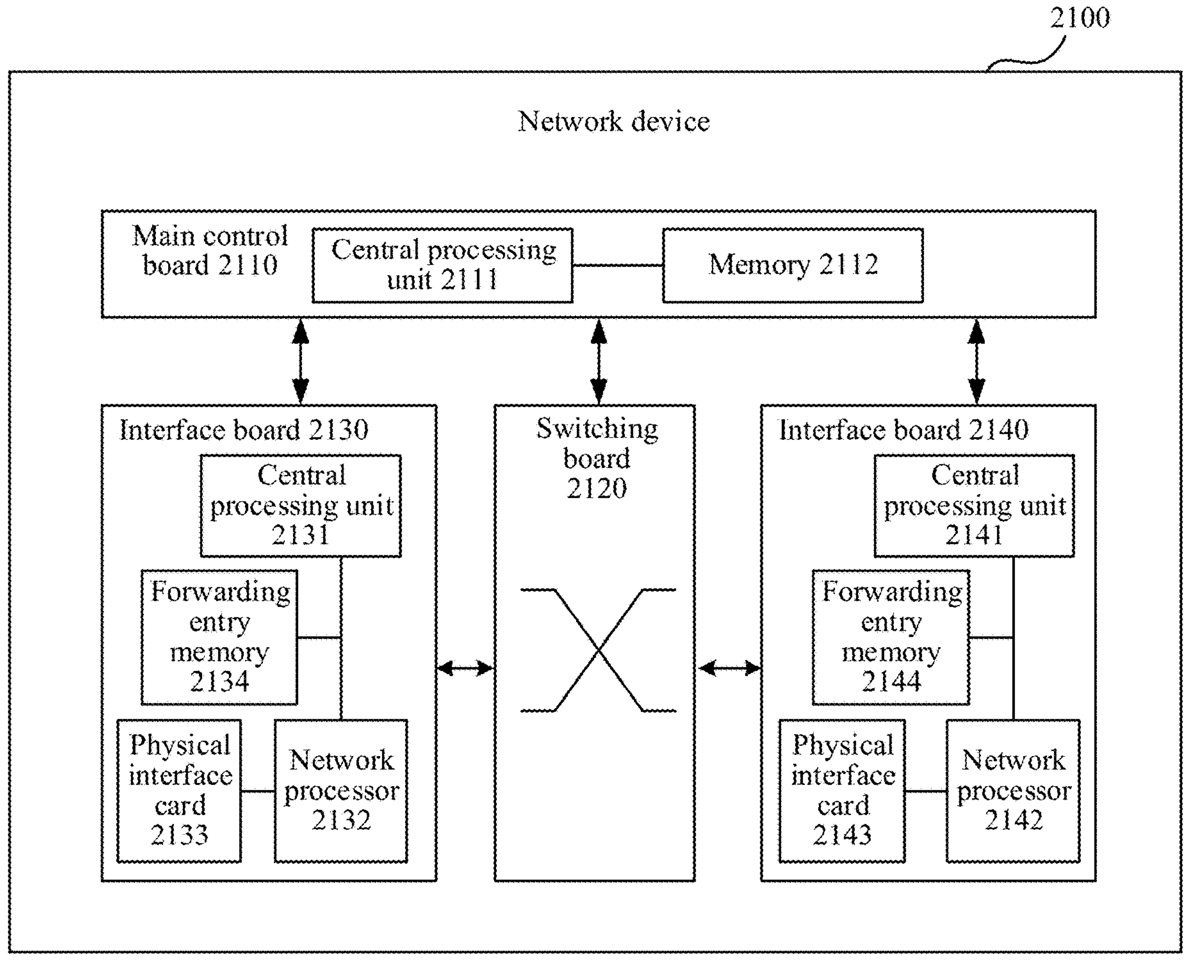
FIG. 12 is a schematic diagram of a structure of another network device according to an embodiment of this application.

FIG. 12 is a schematic diagram of a structure of a network device 2100 provided in another example embodiment of this application. The network device 2100 shown in FIG. 12 is configured to perform all or some of the operations in the method shown in FIG. 2 and FIG. 7. The network device 2100 is, for example, a switch or a router. The network device 2100 may be implemented by a generic bus architecture.

As shown in FIG. 12, the network device 2100 includes a main control board 2110 and an interface board 2130.

The main control board is also referred to as a main processing unit (MPU) or a route processor card. The main control board 2110 is configured to: control and manage each component in the network device 2100, including functions of route calculation, device management, device maintenance, and protocol processing. The main control board 2110 includes a central processing unit 2111 and a memory 2112.

The interface board 2130 is also referred to as a line interface unit card (LPU), a line card, or a service board. The interface board 2130 is configured to: provide various service interfaces and implement data packet forwarding. The service interfaces include but are not limited to an ethernet interface and a POS (packet over SONET/SDH) interface. The ethernet interface is, for example, a flexible ethernet service interface (FlexE Clients). The interface board 2130 includes: a central processing unit 2131, a network processor 2132, a forwarding entry memory 2134, and a physical interface card (PIC) 2133.

The central processing unit 2131 on the interface board 2130 is configured to: control and manage the interface board 2130 and communicate with the central processing unit 2111 on the main control board 2110.

The network processor 2132 is configured to implement packet sending processing. A form of the network processor 2132 may be a forwarding chip. The forwarding chip may be a network processor (NP). In some embodiments, the forwarding chip may be implemented by using an application-specific integrated circuit (ASIC) or a field programmable gate array (FPGA). In one embodiment, the network processor 2132 is configured to forward a received packet based on a forwarding table stored in the forwarding entry memory 2134. If a destination address of the packet is an address of the network device 2100, the network processor 2132 sends the packet to a CPU (for example, the central processing unit 2131) for processing. If a destination address of the packet is not an address of the network device 2100, the network processor 2132 finds, from the forwarding table based on the destination address, a next hop and an egress interface that correspond to the destination address, and forwards the packet to the egress interface corresponding to the destination address. Processing an uplink packet may include: processing an inbound interface of the packet and searching a forwarding table. Processing a downlink packet may include: searching a forwarding table, and the like. In some embodiments, the central processing unit may also perform a function of a forwarding chip, for example, implement software forwarding based on a general-purpose CPU, so that no forwarding chip is needed in the interface board.

The physical interface card 2133 is configured to implement a physical layer interconnection function, so that original traffic enters the interface board 2130, and a processed packet is sent out from the physical interface card 2133. The physical interface card 2133 is also referred to as a subcard, may be installed on the interface board 2130, and is responsible for converting an optical/electrical signal into a packet, performing validity check on the packet, and then forwarding the packet to the network processor 2132 for processing. In some embodiments, the central processing unit 2131 may also perform a function of the network processor 2132, for example, implement software forwarding based on a general-purpose CPU. Therefore, the network processor 2132 is not needed in the physical interface card 2133.

In one embodiment, the network device 2100 includes a plurality of interface boards. For example, the network device 2100 further includes an interface board 2140. The interface board 2140 includes a central processing unit 2141, a network processor 2142, a forwarding entry memory 2144, and a physical interface card 2143. Functions and implementations of components in the interface board 2140 are the same as or similar to those of the interface board 2130, and details are not described herein again.

In one embodiment, the network device 2100 further includes a switching board 2120. The switching board 2120 may also be referred to as a switch fabric unit (SFU). When the network device has a plurality of interface boards, the switching board 2120 is configured to perform data exchange between the interface boards. For example, the interface board 2130 and the interface board 2140 may communicate with each other by using the switching board 2120.

The main control board 2110 is coupled to the interface board. For example, the main control board 2110, the interface board 2130, the interface board 2140, and the switching board 2120 are connected to a system backboard by using a system bus for interworking. In a possible implementation, an inter-process communication (IPC) protocol channel is established between the main control board 2110, the interface board 2130, and the interface board 2140. The main control board 2110 communicates with the interface board 2130 and the interface board 2140 through the IPC channel.

Logically, the network device 2100 includes a control plane and a forwarding plane. The control plane includes a main control board 2110 and a central processing unit 2111. The forwarding plane includes components that perform forwarding, for example, a forwarding entry memory 2134, a physical interface card 2133, and a network processor 2132. The control plane performs functions such as a router, generating a forwarding table, processing signaling and protocol packets, and configuring and maintaining a state of the network device. The control plane delivers the generated forwarding table to the forwarding plane. On the forwarding plane, the network processor 2132 searches, based on the forwarding table delivered by the control plane, a table for forwarding the packet received by the physical interface card 2133. The forwarding table delivered by the control plane may be stored in the forwarding entry memory 2134. In some embodiments, the control plane and the forwarding plane may be completely separated, and are not on a same network device.

It should be noted that there may be one or more main control boards, and when there are a plurality of main control boards, a primary main control board and a secondary main control board may be included. There may be one or more interface boards. A network device with a stronger data processing capability provides a larger quantity of interface boards. There may also be one or more physical interface cards on the interface board. There may be no switching board or one or more switching boards. When there are a plurality of switching boards, load balancing and redundancy backup may be implemented together. In a centralized forwarding architecture, a network device may not need a switching board, and an interface board performs a function of processing service data of an entire system. In a distributed forwarding architecture, a network device may have at least one switching board, and implements data exchange between a plurality of interface boards by using the switching board, to provide a large-capacity data exchange and processing capability. Therefore, a data access and processing capability of a network device of a distributed architecture is greater than that of a network device of a centralized architecture. In one embodiment, the form of the network device may alternatively be a single board. That is, there is no switch fabric board, and functions of the interface board and the main control board are integrated into the board. In this case, the central processing unit on the interface board and the central processing unit on the main control board may be combined into one central processing unit on the board. The one central processing unit on the board performs functions of the two central processing units existing after the two central processing units are combined. The network device in this form has low data exchange and processing capabilities (for example, a network device such as a low-end switch or router). An architecture that is to be used depends on a networking deployment scenario. This is not limited herein.

In one embodiment, the network device 2100 corresponds to the apparatuses shown in FIG. 8 and FIG. 9. In some embodiments, the obtaining module 801 and the obtaining module 901 in the apparatuses shown in FIG. 8 and FIG. 9 are equivalent to a physical interface card 2133 or a physical interface card 2143 in the network device 2100. The first encoding module 802 and the decoding module 902 in the apparatuses shown in FIG. 8 and FIG. 9 are equivalent to at least one of the central processing unit 2111, the network processor 2132, and the network processor 2142 in the network device 2100.

Based on the network devices shown in FIG. 10, FIG. 11, and FIG. 12, an embodiment of this application further provides a communication system. The system includes a first network device and a second network device. In one embodiment, the first network device is the network device 1500 shown in FIG. 10, the network device 2000 shown in FIG. 11, or the network device 2100 shown in FIG. 12, and the second edge network device is the network device 1500 shown in FIG. 10, the network device 2000 shown in FIG. 11, or the network device 2100 shown in FIG. 12.

For methods performed by the first network device and the second network device, refer to related descriptions of the embodiments shown in FIG. 1, FIG. 2, and FIG. 7. Details are not described herein again.

It should be understood that the processor may be a central processing unit (CPU), or may be another general-purpose processor, a digital signal processor (DSP), an application-specific integrated circuit (ASIC), a field-programmable gate array (FPGA) or another programmable logic device, a discrete gate or a transistor logic device, a discrete hardware component, or the like. The general-purpose processor may be a microprocessor, any conventional processor, or the like. It should be noted that the processor may be a processor that supports an advanced reduced instruction set computing machines (ARM) architecture.

Further, in one embodiment, the memory may include a read-only memory and a random access memory, and provide instructions and data for the processor. The memory may further include a nonvolatile random access memory. For example, the memory may further store information of a device type.

The memory may be a volatile memory or a non-volatile memory, or may include both a volatile memory and a non-volatile memory. The nonvolatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (random access memory, RAM) that is used as an external cache. By way of example, and not limitation, many forms of RAMs are available, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DR RAM).

A computer-readable storage medium is further provided. The storage medium stores at least one program instruction or code. When the program instruction or the code is loaded and executed by a processor, a computer is enabled to implement the encoding method in FIG. 2 or the decoding method in FIG. 7.

This application provides a computer program (product). When the computer program is executed by a computer, a processor or the computer is enabled to perform corresponding operations and/or procedures in the foregoing method embodiments.

A chip is provided, including a processor. The chip is configured to invoke, from a memory, and run instructions stored in the memory, so that a communication device with the chip installed performs the methods in the foregoing aspects.

Another chip is provided. The chip includes an input interface, an output interface, a processor, and a memory. The input interface, the output interface, the processor, and the memory are connected through an internal connection path. The processor is configured to execute code in the memory. When the code is executed, the processor is configured to perform the methods in the foregoing aspects.

A device is further provided. The device includes the foregoing chip. In one embodiment, the device is a network device. For example, the device is a router, a switch, or a server.

All or some of the foregoing embodiments may be implemented by using software, hardware, firmware, or any combination thereof. When software is used to implement the embodiments, all or a part of the embodiments may be implemented in a form of a computer program product. The computer program product includes one or more computer instructions. When the computer program instructions are loaded and executed on the computer, the procedure or functions according to this application are all or partially generated. The computer may be a general-purpose computer, a dedicated computer, a computer network, or other programmable apparatuses. The computer instructions may be stored in a computer-readable storage medium, or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner. The computer-readable storage medium may be any usable medium accessible by the computer, or a data storage device, for example, a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

In the foregoing implementations, the objectives, technical solutions, and beneficial effects of this application are further described in detail. It should be understood that the foregoing descriptions are merely implementations of this application, but are not intended to limit the protection scope of this application. Any modification, equivalent replacement, improvement, or the like made based on the technical solutions of this application shall fall within the protection scope of this application.

A person of ordinary skill in the art may be aware that, with reference to the method operations and modules described in embodiments disclosed in this specification, the method operations and modules can be implemented by using software, hardware, firmware, or any combination thereof. To clearly describe interchangeability between the hardware and the software, the operations and compositions of embodiments have been generally described in terms of functions in the foregoing descriptions. Whether the functions are performed by the hardware or the software depends on particular applications and design constraints of the technical solutions. A person of ordinary skill in the art may use different methods to implement the described functions for each particular application, but it should not be considered that the implementation goes beyond the scope of this application.

A person of ordinary skill in the art may understand that all or some of the operations of embodiments may be implemented by hardware or a program instructing related hardware. The program may be stored in a computer-readable storage medium. The storage medium may include: a read-only memory, a magnetic disk, or an optical disc.

When software is used to implement the embodiments, all or a part of the embodiments may be implemented in a form of a computer program product. The computer program product includes one or more computer program instructions. In an example, the method according to embodiments of this application may be described in the context of machine-executable instructions. For example, the machine-executable instructions are included in a program module that is in a component for execution on a real or virtual processor of a target. Generally, the program module includes a routine, a program, a library, an object, a class, a component, a data structure, and the like, and executes a task or implements an abstract data structure. In various embodiments, the functions of the program modules may be combined or split between the described program modules. The machine-executable instructions for the program module may be executed locally or within a distributed device. In the distributed device, the program module may be located in both a local storage medium and a remote storage medium.

Computer program code for implementing the method in embodiments of this application may be written in one or more programming languages. The computer program code may be provided for a processor of a general-purpose computer, a dedicated computer, or another programmable data processing apparatus, so that when the program code is executed by the computer or the another programmable data processing apparatus, functions/operations specified in the flowcharts and/or block diagrams are implemented. The program code may be executed entirely on a computer, executed partially on a computer, executed as a standalone software package, executed partially on a computer and partially on a remote computer, or executed entirely on a remote computer or a server.

In the context of embodiments of this application, computer program code or related data may be carried in any appropriate carrier, so that the device, the apparatus, or the processor can perform various types of processing and operations described above. Examples of the carrier include a signal, a computer-readable medium, and the like.

Examples of the signal may include an electrical signal, an optical signal, a radio signal, a voice signal, or other forms of propagated signals, such as a carrier wave and an infrared signal.

A machine-readable medium may be any tangible medium that includes or stores programs for or with respect to an instruction execution system, apparatus, or device. The machine-readable medium may be a machine-readable signal medium or a machine-readable storage medium. The machine-readable medium may include but is not limited to an electronic, magnetic, optical, electromagnetic, infrared, or semiconductor system, apparatus, or device, or any appropriate combination thereof. A more detailed example of the machine-readable storage medium includes an electrical connection with one or more wires, a portable computer disk, a hard disk, a random access memory (RAM), a read-only memory (ROM), an erasable programmable read-only memory (EPROM or flash memory), an optical storage device, a magnetic storage device, or any appropriate combination thereof.

It may be clearly understood by a person skilled in the art that, for the purpose of convenient and brief description, for a detailed working process of the foregoing system, device, and module, refer to a corresponding process in the foregoing method embodiments. Details are not described herein again.

In the several embodiments provided in this application, it should be understood that the disclosed system, device, and method may be implemented in other manners. For example, the described device embodiment is merely an example. For example, division into modules is merely division into logical functions and there may be other division modes during actual application. For example, a plurality of modules or components may be combined or may be integrated to another system, or some characteristics may be ignored or not executed. In addition, the displayed or discussed mutual couplings or direct couplings or communication connections may be indirect couplings or communication connections implemented through some interfaces, devices, or modules, or may be electrical, mechanical, or other forms of connections.

The modules described as separate components may or may not be physically separate, and components displayed as modules may or may not be physical modules, may be located at one position, or may be distributed on a plurality of network modules. Some or all of the modules may be selected based on actual requirements to implement the objectives of the solutions of embodiments of this application.

In addition, functional modules in embodiments of this application may be integrated into one processing module, or each of the modules may exist alone physically, or two or more modules may be integrated into one module. The integrated module may be implemented in a form of hardware, or may be implemented in a form of a software functional module.

If the integrated module is implemented in the form of the software functional module and sold or used as an independent product, the integrated module may be stored in a computer-readable storage medium. Based on this understanding, the technical solutions of this application essentially, or the part contributing to the conventional technology, or all or some of the technical solutions may be implemented in a form of a software product. The computer software product is stored in a storage medium, and includes several instructions for instructing a computer device (which may be a personal computer, a server, or a network device) to perform all or some of the operations of the method described in embodiments of this application. The foregoing storage medium includes any medium that can store program code, such as a USB flash drive, a removable hard disk, a read-only memory (ROM), a random access memory (RAM), a magnetic disk, or an optical disc.

In this application, terms such as "first" and "second" are used to distinguish between same items or similar items that have basically same functions. It should be understood that "first", "second", and "$n^{th}$" do not have a logical or time sequential dependency relationship, and do not limit the quantity and execution sequence. It should also be understood that although the following descriptions use terms such as "first" and "second" to describe various elements, these elements should not be limited by the terms. These terms are simply used to distinguish one element from another. For example, without departing from the scope of various examples, a first network device may be referred to as a second network device, and similarly, a second network device may be referred to as a first network device. Both the first network device and the second network device may be any type of network devices, and in some cases, may be separate and different network devices.

It should be further understood that, in embodiments of this application, sequence numbers of the processes do not mean execution sequences. The execution sequences of the processes should be determined based on functions and internal logic of the processes, and should not be construed as any limitation on implementation processes of embodiments of this application.

In this application, the term "at least one" means one or more, and the term "a plurality of" in this application means two or more. For example, a plurality of second packets means two or more second packets. The terms "system" and "network" are often used interchangeably herein.

It should be understood that the terms used in the descriptions of the various examples herein are merely intended to describe examples and are not intended to impose a limitation. As used in the descriptions of the various examples and in the appended claims, singular forms "one ("a" or "an")" and "the" are intended to also include a plural form, unless otherwise explicitly indicated in the context.

It should further be understood that the term "include" (also referred to as "includes", "including", "comprises", and/or "comprising") used in this specification specifies presence of the stated features, integers, steps, operations, elements, and/or components, with presence or addition of one or more other features, integers, steps, operations, elements, components, and/or their components not excluded.

It should be further understood that the term "if" may be interpreted as a meaning of "when" ("when" or "upon"), "in response to determining", or "in response to detecting". Similarly, according to the context, the phrase "if it is determined that" or "if (a stated condition or event) is detected" may be interpreted as a meaning of "when it is determined that" or "in response to determining" or "when (a stated condition or event) is detected" or "in response to detecting (a stated condition or event)".

It should be understood that determining B based on A does not mean that B is determined based only on A, and B may alternatively be determined based on A and/or other information.

It should further be understood that "one embodiment", "an embodiment", and "a possible implementation" mentioned throughout the specification mean that a feature, structure, or characteristic related to the embodiment or an implementation is included in at least one embodiment of this application. Therefore, "in one embodiment" or "in an embodiment" or "a possible implementation" appearing throughout the specification may not necessarily refer to a same embodiment. In addition, these particular features, structures, or characteristics may be combined in one or more embodiments by using any appropriate manner.

The invention claimed is:

1. An encoding method, wherein the method comprises:

obtaining $2^n$ groups of code stream blocks, wherein at least one group of the $2^n$ groups of code stream blocks comprises a control block and a data block, and n is an integer greater than 1; and performing a first encoding on the $2^n$ groups of code stream blocks to obtain a target code block, wherein the target code block comprises a type determined based on the control blocks in the $2^n$ groups of code stream blocks and a data unit determined based on the control blocks and the data blocks in the $2^n$ groups of code stream blocks.

2. The method according to claim 1, wherein the type indicates that the target code block is a data code block; and the data unit is obtained by performing the first encoding on the data blocks in the $2^n$ groups of code stream blocks in a sequence of the $2^n$ groups of code stream blocks.

3. The method according to claim 1, wherein the type indicates that the target code block is a control code block;

the data unit comprises a type indication and code block content obtained by performing the first encoding on the data blocks in the $2^n$ groups of code stream blocks in a sequence determined based on the control blocks and the data blocks in the $2^n$ groups of code stream blocks; and the type indication indicates a type of each group of code stream blocks and is obtained based on the control blocks in the $2^n$ groups of code stream blocks.

4. The method according to claim 3, wherein the target code block is an error code block comprising error indication data.

5. The method according to claim 1, wherein the target code block is obtained by processing the $2^n$ groups of code stream blocks based on an error detection result; and the error detection result is obtained based on the control blocks and the data blocks in the $2^n$ groups of code stream blocks.

6. The method according to claim 5, wherein the error detection result comprises a content sequence error or content error of the $2^n$ groups of code stream blocks;

the target code block is obtained by performing the first encoding based on a code stream block that has a correct content sequence and correct content and an error block in the $2^n$ groups of code stream blocks; and the error block is obtained based on a code stream block that has a content sequence error or content error in the $2^n$ groups of code stream blocks.

7. An encoding apparatus, wherein the apparatus comprises:

a memory storing instructions; and a processor coupled to the memory to execute the instructions to:

obtain $2^n$ groups of code stream blocks, wherein at least one group of the $2^n$ groups of code stream blocks comprises a control block and a data block, and n is an integer greater than 1; and perform a first encoding on the $2^n$ groups of code stream blocks to obtain a target code block, wherein the target code block comprises a type determined based on the control blocks in the $2^n$ groups of code stream blocks and a data unit determined based on the control blocks and data blocks in the $2^n$ groups of code stream blocks.

8. The apparatus according to claim 7, wherein the type indicates that the target code block is a data code block; and the data unit is obtained by performing the first encoding on the data blocks in the $2^n$ groups of code stream blocks in a sequence of the $2^n$ groups of code stream blocks.

9. The apparatus according to claim 7, wherein the type indicates that the target code block is a control code block;

the data unit comprises a type indication and code block content obtained by performing the first encoding on the data blocks in the $2^n$ groups of code stream blocks in a sequence determined based on the control blocks and the data blocks in the $2^n$ groups of code stream blocks; and the type indication indicates a type of each group of code stream blocks and is obtained based on the control blocks in the $2^n$ groups of code stream blocks.

10. The apparatus according to claim 9, wherein the target code block is an error code block comprising error indication data.

11. The apparatus according to claim 7, wherein the target code block is obtained by processing the $2^n$ groups of code stream blocks based on an error detection result; and the error detection result is obtained based on the control blocks and the data blocks in the $2^n$ groups of code stream blocks.

12. The apparatus according to claim 11, wherein the error detection result comprises a content sequence error or content error of the $2^n$ groups of code stream blocks;

the target code block is obtained by performing the first encoding based on a code stream block that has a correct content sequence and correct content and an error block in the $2^n$ groups of code stream blocks; and the error block is obtained based on a code stream block that has a content sequence error or content error in the $2^n$ groups of code stream blocks.

13. The apparatus according to claim 7, wherein the control block comprises m bits, the data block comprises 8m bits, and m is a positive integer.

14. A decoding apparatus, wherein the apparatus comprises:

a memory storing instructions; and a processor coupled to the memory to execute the instructions to:

obtain a target code block comprising a type and a data unit; and perform a first decoding on the target code block based on the type and the data unit of the target code block to obtain $2^n$ groups of code stream blocks, wherein at least one group of code stream blocks comprises a control block and a data block that are obtained based on the type and the data unit, and n is an integer greater than 1.

15. The apparatus according to claim 14, wherein the type indicates that the target code block is a data code block;

a data block comprised in group i of code stream blocks in the $2^n$ groups of code stream blocks is obtained by performing the first decoding on content, in the data unit, that corresponds to the group i of code stream blocks and that has a length of 8m; and m is a positive integer, and i is an integer greater than or equal to 1 and less than or equal to $2^n$, or i is an integer greater than or equal to 0 and less than or equal to $2^n-1$.

16. The apparatus according to claim 14, wherein the type indicates that the target code block is a control code block;

the data unit comprises a type indication and code block content;

the type indication comprises $2^n$ bits, one bit in the $2^n$ bits indicates a type of one group of code stream blocks corresponding to the bit that is in the $2^n$ groups of code stream blocks, and the code block content comprises $2^n$ bit groups;

a control block comprised in group i of code stream blocks in the $2^n$ groups of code stream blocks is obtained based on the type;

a bit that corresponds to group i of code stream blocks and that is in the type indication, and a bit group that corresponds to group i of code stream blocks and that is in the code block content, wherein i is an integer greater than or equal to 1 and less than or equal to $2^n$, or i is an integer greater than or equal to 0 and less than or equal to $2^n-1$; and the data block comprised in group i of code stream blocks in the $2^n$ groups of code stream blocks is obtained by performing, based on the bit that corresponds to group i of code stream blocks and that is in the type indication, the first decoding on the bit group that corresponds to group i of code stream blocks and that is in the code block content.

17. The apparatus according to claim 16, wherein the $2^n$ bit groups comprise a first bit group and $2^n-1$ second bit groups; and a quantity of bits comprised in the first bit group is different from a quantity of bits comprised in the 2n−1 second bit groups.

18. The apparatus according to claim 17, wherein the data unit comprises a type indication, and the type and the type indication indicate that the target code block is an error code block; and a control block comprised in each group of the $2^n$ groups of code stream blocks is a first value, a data block comprised in each group of the $2^n$ groups of code stream blocks is a second value; and the first value and the second value indicate that the code stream block is an error code stream block.

19. The apparatus according to claim 14, wherein the processor to:

receive second data, wherein the second data is obtained based on first data that is encoded by using a forward error correction FEC code type; and perform second decoding on the second data to obtain the target code block, wherein the second decoding is error correction processing.

20. The apparatus according to claim 19, wherein the target code block is an error code block obtained when error correction is performed on the second data and fails.

* * * * *